(12) United States Patent
Usami et al.

(10) Patent No.: US 7,201,328 B2
(45) Date of Patent: *Apr. 10, 2007

(54) SEMICONDUCTOR DEVICES AND MANUFACTURING METHOD THEREFOR AND ELECTRIC COMMERCE METHOD AND TRANSPONDER READER

(75) Inventors: Mitsuo Usami, Tachikawa (JP); Akira Sato, Fuchu (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/370,902

(22) Filed: Mar. 9, 2006

(65) Prior Publication Data

US 2006/0151620 A1 Jul. 13, 2006

Related U.S. Application Data

(62) Division of application No. 10/606,778, filed on Jun. 27, 2003, now Pat. No. 7,036,741.

(30) Foreign Application Priority Data

Aug. 8, 2002 (JP) .............................. 2002-231024
Dec. 24, 2002 (JP) .............................. 2002-371703

(51) Int. Cl.
*G06K 19/06* (2006.01)
(52) U.S. Cl. ............. 235/492; 340/572.7; 343/700 MS
(58) Field of Classification Search ............... 235/491, 235/451; 340/572.7, 572.8
See application file for complete search history.

(56) References Cited

U.S. PATENT DOCUMENTS

| 4,691,304 | A | * | 9/1987 | Hori et al. | .................. | 365/226 |
| 4,816,839 | A | * | 3/1989 | Landt | .......................... | 343/795 |
| 5,027,107 | A | | 6/1991 | Matsuno et al. | | |
| 5,781,159 | A | | 7/1998 | Desargant | | |
| 5,786,626 | A | | 7/1998 | Brady et al. | ................ | 257/673 |
| 6,011,488 | A | * | 1/2000 | Busser | .................... | 340/10.34 |
| 6,504,507 | B2 | | 1/2003 | Geeraert | | |
| 6,525,410 | B1 | * | 2/2003 | Gelsomini et al. | ......... | 257/678 |
| 6,563,463 | B1 | * | 5/2003 | Saito | ................... | 343/700 MS |
| 6,657,432 | B1 | | 12/2003 | Morrone | | |
| 6,657,542 | B2 | * | 12/2003 | Usami | .................... | 340/572.8 |
| 6,762,682 | B2 | * | 7/2004 | Okamoto et al. | ........ | 340/572.7 |

(Continued)

FOREIGN PATENT DOCUMENTS

JP  4-119645  4/1992

(Continued)

*Primary Examiner*—Jared J. Fureman
(74) *Attorney, Agent, or Firm*—Antonelli, Terry, Stout & Kraus, LLP.

(57) ABSTRACT

A wireless IC tag is provided which includes a plate-shaped first conductor, a plate-shaped second conductor, and an IC chip which is sandwiched between the first conductor and the second conductor via a front surface and a rear surface of the IC chip. The IC chip includes a double voltage rectifier circuit to rectify an alternating voltage induced between the front surface and the rear surface of the IC chip. The second conductor functions as an antenna and also includes a slit extending from a center portion thereof in a longitudinal direction. The first conductor electrically connects both sides of the slit via the front surface and the rear surface of the IC chip.

17 Claims, 29 Drawing Sheets

U.S. PATENT DOCUMENTS

| | | |
|---|---|---|
| 6,795,025 B2 | 9/2004 | Saito |
| 6,836,248 B2 | 12/2004 | Fukushima et al. |
| 6,900,536 B1 | 5/2005 | Derbenwick et al. |
| 6,930,401 B2 | 8/2005 | Usami |
| 6,985,119 B2 * | 1/2006 | Forster et al. ........... 340/572.7 |
| 7,036,741 B2 * | 5/2006 | Usami et al. ............... 235/492 |
| 2005/0093677 A1 | 5/2005 | Forster et al. |
| 2005/0134460 A1 | 6/2005 | Usami |
| 2005/0275591 A1 * | 12/2005 | King et al. .......... 343/700 MS |

FOREIGN PATENT DOCUMENTS

| | | |
|---|---|---|
| JP | 10-13296 | 1/1998 |
| JP | 2000-76406 | 3/2000 |
| JP | 2000-132653 | 5/2000 |
| JP | 2001-94031 | 4/2001 |
| JP | 2002-366917 | 12/2002 |

* cited by examiner

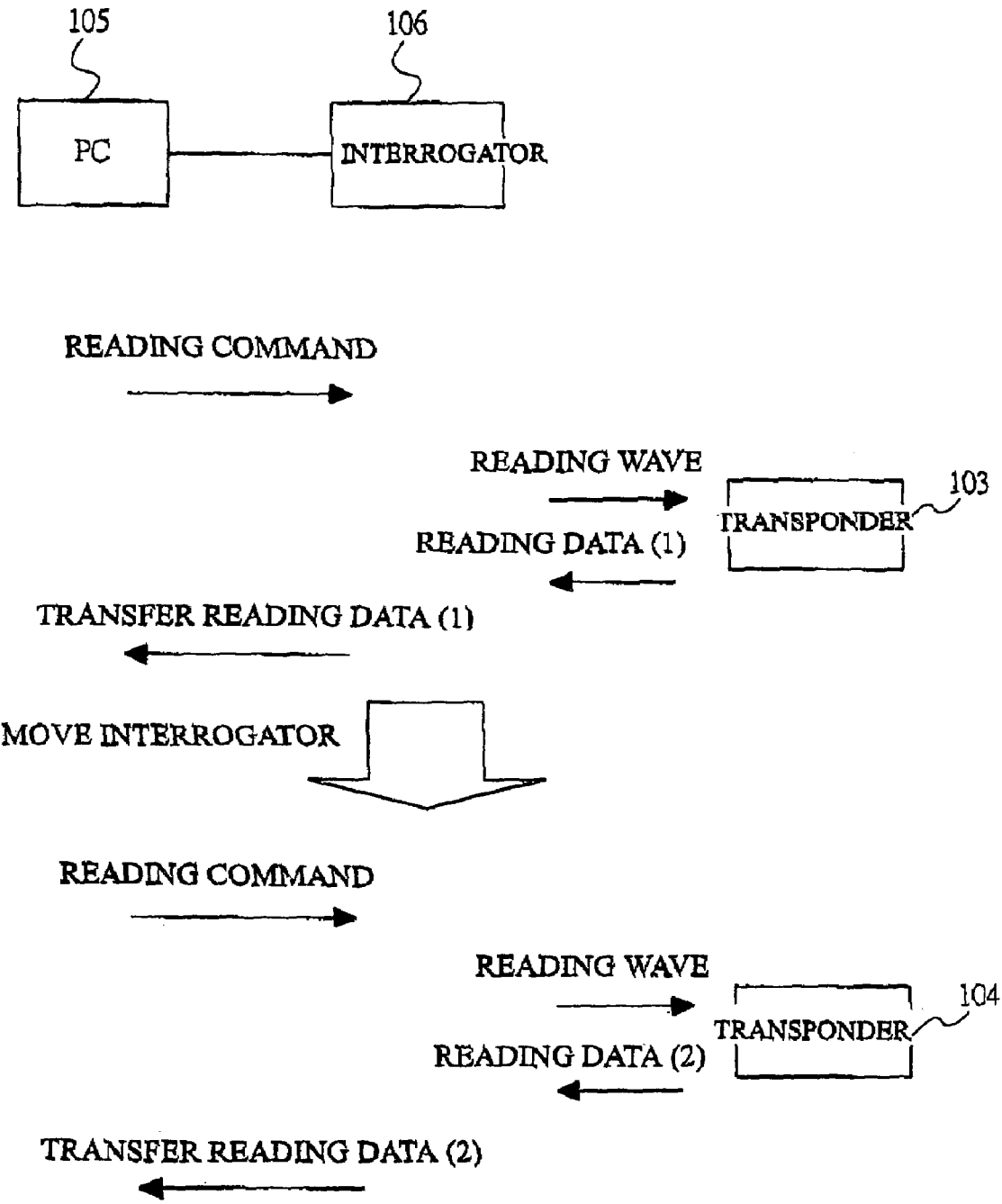

SEMICONDUCTOR DEVICES AND MANUFACTURING METHOD THEREFOR AND ELECTRIC COMMERCE METHOD AND TRANSPONDER READER

CROSS REFERENCE TO RELATED APPLICATION

This application is a divisional application of application Ser. No. 10/606,778, filed Jun. 27, 2003 now U.S. Pat. No. 7,036,741, the entire disclosure of which is hereby incorporated by reference.

BACKGROUND OF THE INVENTION

The present invention relates to a semiconductor device, a manufacturing method for the semiconductor device, an electronic commerce method, and a transponder reader, and more particularly to a technique effectively applied to a structure of a wireless IC chip used to identify an object in a non-contact manner, an IC tag for wirelessly sending an identification number, a transponder, or the like.

For example, the following techniques can be taken as techniques examined by the inventors of the present invention with respect to a wireless IC tag employing a wireless IC chip and/or to a transponder reader etc.

For example, the wireless IC tag is fabricated with the structure as shown in FIG. 29. The structure is not the technique of the wireless IC tag but is obtained by applying the technique (see, for example, Patent Document 1) used in the manufacturing method for a semiconductor device such as a transistor. A plurality of electrodes (bumps or the like) 41 are formed on a wireless IC chip 16a, and these electrodes 41 are connected to conductors such as metal patterns 43 etc. on a substrate 44. In general, the metal pattern 43 is connected to an antenna pattern (see, for example, Patent Document 1).

In addition, there are some wireless IC tags in which an end of a loop-shaped antenna is connected to a plurality of electrodes formed on one surface (front surface) of a wireless IC chip (see, for example, Patent Documents 2, 3 and 4).

Also, the structure of the wireless IC tag is commonly adopted even in a wireless identification transponder.

Furthermore, there has not been a conventional system for utilizing an identification number of the transponder and a personal identification number of the cellular phone to make an order and a check, etc. by the cellular phone.

Also, an interrogator in the transponder reader repeats the identifying of one transponder, in accordance with a command from an upper connection machine connected to the interrogator via a wired or wireless means, to send back identification information to the upper connection machine.

An example of the transponder reader will be described with reference to FIG. 31. An upper connection machine such as a PC (personal computer) and an interrogator reading the identification information of the transponder through radio wave are connected via a serial or parallel interface such as RS232C etc.

For example, it is assumed that a reading command is issued from the PC 105 to the interrogator 106. The interrogator 106 sends reading wave to the transponder 103 in accordance with such command, and the transponder 103 receives rated energy and clock signal and sends identification information such as reading data (1) included in the transponder 103, to the interrogator 106 from the transponder 103. When confirming valid reception, that is, reception with no errors, the interrogator 106 transfers the reading data (1) to the PC 105 via the serial interface or the parallel interface. The PC 105 finally communicates the data to an application soft, by a software processing in an operating system. When receiving the data, the application soft issues the next reading command to demand data from the next transponder 104. During this time, the interrogator 106 moves and transmits reading wave to the next transponder 104.

In FIG. 31, although there is illustrated the case where the interrogator is movable, the model in which the transponder is movable is also all the same as the case. The transponder 104 transmits reading data (2) to the interrogator 106 through a predetermined procedure, and the interrogator 106 transfers the reading data (2) to the PC 105.

In FIG. 31, there is illustrated the case where the number of transponders is only one or two. However, even when three or more transponders are generally used, similarly the reading command is repeatedly sent to each of the transponders and data obtained therefrom are read.

[Patent Document 1]
Japanese Patent Laid-Open No. 4-119645 (Abstract in page 1 and the like, and FIG. 1(d))

[Patent Document 2]
Japanese Patent Laid-Open No. 10-13296 (Abstract in page 1 and the like, and FIG. 3)

[Patent Document 3]
Japanese Patent Laid-Open No. 2000-76406 (Abstract in page 1 and the like, and FIG. 1).

[Patent Document 4]
Japanese Patent Laid-Open No. 2000-132653 (Abstract in page 1 and the like, and FIG. 1).

SUMMARY OF THE INVENTION

Meanwhile, as a result of the fact that the inventors have examined the techniques of the wireless IC tag employing the wireless IC chip, the electronic commerce method, and the transponder reader, etc. as described above, the following has become apparent.

First, in the wireless IC tag, the following problems occurs because a plurality of electrodes have to be placed on one surface (front surface) of the wireless IC chip.

Firstly, the smaller the chip size of the wireless IC chip is, the smaller the size of the electrode becomes, thereby causing the size reduction of a connection area. Consequently, the connection resistance thereof is increased and the operation of the wireless IC chip becomes unstable.

Secondly, when the size of the wireless IC chip is reduced, each size of a plurality of electrodes and the spaces therebetween are also reduced. Accordingly, an advanced technique is required in aligning therewith the conductors such as metal patterns on a substrate side, whereby it becomes impossible to economically manufacture the wireless IC tag and the wireless identification transponder.

Thirdly, as shown in FIG. 29, since the gap occurs between the wireless IC chip and the substrate, the chip is easy to be broken when a stress is applied to the wireless IC chip. For its countermeasure, when encapsulation resin as underfill is encapsulated in this gap, the number of materials and steps is inevitably increased. Therefore, it becomes impossible to economically manufacture the wireless IC tag and the wireless identification transponder, etc.

Fourthly, when the size of the wireless IC chip is reduced, it becomes difficult to properly arrange the upper surfaces of the IC chips in the manufacturing process and to economically manufacture the wireless IC tag and the wireless identification transponder, etc.

Also, in the commerce trade, even though a product itself can be confirmed in the case of making a shortage order and/or a repeat order of the product, it is necessary to call a supplier of the product, such as a maker, at the time of the order to make such confirmation and perform order bill transaction and/or terminal process. Therefore, it takes time and manpower and thereby speediness, accuracy, and economical efficiency have lacked in some aspects.

Additionally, in the case of reading the identification information of the transponder according to the conventional method, a software process called a command is inevitably required between the upper connection machine and the interrogator when reading each of the transponders. Further, when the identification information of the transponder is read successively and with high speed, the software process becomes an overhead and thereby it has been necessary to achieve a time reduction in the successive reading.

Thus, an object of the present invention is, in a semiconductor device such as a wireless IC tag employing a wireless IC chip, and a wireless identification transponder, etc., to provide a semiconductor device and its manufacturing method capable of ensuring a stress strength and manufacturing the semiconductor device economically. Further, another object of the present invention is to provide a semiconductor device and its manufacturing method capable of certainly achieving the impedance matching, by improving the structure of a semiconductor device such as a wireless IC tag etc. without causing the problem of a reduction in communication distance.

Also, another object of the present invention is to improve the speediness, accuracy, and economic efficiency in making an order and a check of a product in the electronic commerce.

Further, another object of the present invention is to increase the reading speed of the identification information of the transponder.

The above and other objects and novel characteristics of the present invention will be apparent from the description of the specification and the accompanying drawings.

The typical ones of the inventions disclosed in this application will be briefly described as follows.

(1) The semiconductor device according to the present invention is characterized in that: electrodes such as bumps etc. are formed on a front and rear surfaces of an IC chip for wirelessly transmitting/receiving data such as an identification number etc.; first and second conductors such as metals for antenna etc. are connected respectively to the electrodes; and the first and second conductors are connected outside the IC chip to form an antenna.

(2) The semiconductor device according to the present invention is characterized in that: electrodes are formed on the front and rear surfaces of an IC chip for wirelessly transmitting/receiving data; first and second conductors are connected respectively to the electrodes; and the electrode formed on the rear surface of the IC chip has the same potential as that of the substrate of the IC chip.

(3) The semiconductor device according to the present invention is characterized in that: electrodes are formed on the front and rear surfaces of an IC chip for wirelessly transmitting/receiving data; first and second conductors are connected respectively to the electrodes; a slit is provided between the first and second conductors when viewed from the front surface side of the IC chip; and the first and second conductors are connected to each other.

(4) The semiconductor device according to the present invention is characterized in that: electrodes are formed on the front and rear surfaces of an IC chip for wirelessly transmitting/receiving data, first and second conductors are connected respectively to the electrodes; the first or second conductors includes a slit; and the first and second conductors are connected to each other.

(5) The semiconductor device according to the present invention is characterized in that; electrodes are formed on the front and rear surfaces of an IC chip for wirelessly transmitting/receiving data; various portions in one conductor are connected respectively to the electrodes; and the conductor includes a slit.

(6) The semiconductor device according to item (5) is further characterized in that the conductors are bent and connected to the electrodes.

(7) The semiconductor device according to item (6) is further characterized in that the conductors before being bent and connected to the electrodes are accommodated in the form of a rectangular shape.

(8) The manufacturing method of a semiconductor device according to the present invention is a manufacturing method for a wireless identification semiconductor device which includes an IC chip for wirelessly transmitting/receiving data, and an antenna connected to the front and rear surface electrodes of the IC chip, the method comprising the steps of: preparing a semiconductor substrate, on one main surface of which a plurality of device layers are formed; forming a first electrode on each surface of the plurality of device layers; grinding the other main surface opposite to the one main surface of the semiconductor substrate; forming a second electrode on the grinded other main surface of the semiconductor substrate; separating the semiconductor substrate into plural pieces to form a plurality of IC chips; and connecting a conductor to be an antenna, to the first and second electrodes of the IC chip.

(9) The manufacturing method of a semiconductor device according to the present invention is the manufacturing method of a wireless identification semiconductor device in item (8), the method being characterized in that, in the step of connecting a conductor to be an antenna, to the first and second electrodes of the IC chip, the conductor includes a slit.

(10) The manufacturing method of a semiconductor device according to the present invention is the manufacturing method of a semiconductor device in item (9), the method further comprising the step of: adjusting the length of the slit with a processing device.

(11) The semiconductor device according to the present invention is characterized in that, in an IC tag utilizing an IC chip for wirelessly sending an identification number, an image of a medium-surface-description information to which the IC tag adheres is taken and the identification number of the IC tag is read, and the IC tag is taken out, and the taken IC tag adheres again to the other medium.

(12) The electronic commerce method according to the present invention is characterized in that, in placing an order or making a confirmation of the product of the same kind by reading the identification number of a transponder attached to a product through an antenna of a cellular phone, the identification number of the transponder and the personal identification number assigned to the cellular phone are combined to communicate the server of the supplier of the product via wireless communication.

(13) The transponder reader according to the present invention is characterized in that: the transponder attached to each of the plurality of media holds the non-duplicated individual identification information; the interrogator to read the transponder is provided; the respective identification information are successively accumulated when the interrogator moves to read the identification information of the transponders attached respectively to media; and the identification information of all the transponders are accumulated; and thereafter the identification information of all the transponders are transferred to the upper connection machine.

(14) The transponder reader according to the present invention is one in which the transponders, attached respectively to the plurality of media, hold the identification information not duplicated with those of the adjacent transponders, the interrogator to read the transponder is provided, the respective identification information are successively accumulated when the interrogator moves to read the identification information of the transponders attached respectively to media, the identification information of all transponders are accumulated, and thereafter the identification information of all transponders are transferred to the upper connection machine, the transponder reader being characterized in that, in reading the identification information of one transponder and thereafter reading the identification data of an transponder adjacent thereto, the double reading of the same information is prevented by comparing with the previously accumulated identification information.

(15) The semiconductor device according to item (1) is further characterized in that the connections between the first and second conductors are attached by means of a press pin.

(16) The semiconductor device according to item (1) is further characterized in that the first and second conductors are connected to each other with anisotropic conductive adhesive.

(17) The semiconductor device according to item (1) is further characterized in that the connections between the first and second conductors are connected to each other with anisotropic conductive adhesive.

(18) The semiconductor device according to item (1) is further characterized in that the first and second conductors are aluminum.

(19) The semiconductor device according to the present invention is characterized in that: electrodes are formed on the front and rear surfaces of an IC chip for wirelessly transmitting/receiving data; first and second conductors are connected respectively to the electrodes; and the semiconductor device operates even when the connection between the conductor and the first and second conductors are reversed.

(20) The semiconductor device according to the present invention is characterized in that: electrodes are formed on the front and rear surfaces of an IC chip for wirelessly transmitting/receiving data; first and second conductors are connected respectively to the electrodes; and the thickness from the outer surface of the first conductor to the outer surface of the second conductor is 100 µm or smaller.

(21) The semiconductor device according to the present invention is characterized in that the first and second conductors are attached to a tape in which holes for a sprocket are formed.

(22) The manufacturing method of a semiconductor device according to the present invention is characterized in that the first and second conductors are attached to each other with anisotropic conductive adhesive to manufacture the semiconductor device of item (1).

(23) The manufacturing method of a semiconductor device according to the present invention is characterized in that the first and second conductors are attached to each other with non conductive adhesive to manufacture the semiconductor device of item (1).

(24) The electronic commerce method according to the present invention is one in which, in placing an order or making a confirmation of the product of the same kind by reading the identification number of a transponder attached to a product through an antenna of a cellular phone, the identification number of the transponder and the personal identification number assigned to the cellular phone are combined to communicate the server of the supplier of the product via wireless communication, the method being characterized in that said transponder includes an IC chip with the size of a 0.5 mm square or smaller, and a radiation antenna, etc.

(25) The electronic commerce method according to the present invention is one in which, in placing an order or making a confirmation of the product of the same kind by reading the identification number of a transponder attached to a product through an antenna of a cellular phone, the identification number of the transponder and the personal identification number assigned to the cellular phone are combined to communicate the server of the supplier of the product via wireless communication, the method being characterized in that said personal identification number is used in the settlement server and the identification number of the transponder is used in the server of a supplier of said product, thereby ensuring the security.

(26) The transponder reader according to the present invention is one in which the transponders, attached respectively to the plurality of media, hold the identification information not duplicated with those of the adjacent transponders, the interrogator to read the transponder is provided, the respective identification information are successively accumulated when the interrogator moves to read the identification information of the transponders attached respectively to media, the identification information of all transponders are accumulated, and thereafter the identification information of all transponders are transferred to the upper connection machine, the transponder reader being characterized in that the transponders attached to the media are uniformly located at the corner portions of the media.

As described above, according to the semiconductor device and its manufacturing method of items (1) to (10) and (15) to (23), the wireless IC tag can be manufactured economically, thereby allowing the stress strength to be ensured.

Also, according to the semiconductor device and its manufacturing method of items (3) to (9), the impedance matching can be surely achieved and therefore such a problem as the reduction of the communication distance does not occur.

Also, according to the semiconductor device of item (11), it is possible to reuse the wireless IC tag, which has been used as a disposable device.

Also, according to the electronic commerce method of items (12) and (24), by establishing the link to the server of the supplier of the product via wireless, it is possible to improve the speediness, the accuracy, and the economic efficiency in placing the order or making the confirmation of a product.

Also according to the transponder reader of items (13), (14) and (26), it is possible to increase the speed of the successive reading of the transponders.

BRIEF DESCRIPTION OF THE DRAWINGS

FIG. 31 is an explanatory diagram showing a device structure of a transponder reader according to a technique that has been examined by the inventors as the premise of the present invention.

DESCRIPTION OF THE PREFERRED EMBODIMENTS

Hereinafter, embodiments of the present invention will be described in detail with reference to the accompanying drawings. Note that components having the same function are denoted by the same reference symbols throughout all the drawings for describing the embodiments, and the repetitive description thereof will be omitted.

(First Embodiment)

Figure 1A:
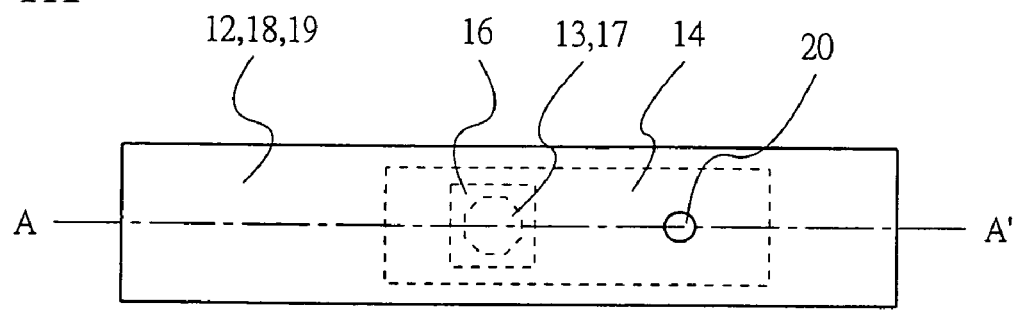
FIG. 1A is a diagram showing a structure of a semiconductor device according to a first embodiment of the present invention and is a plan view.
Figure 1B:
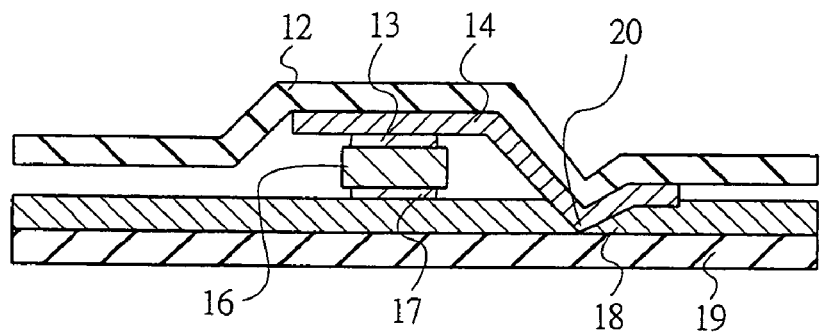
FIG. 1B is a diagram showing a structure of a semiconductor device according to a first embodiment of the present invention and is a cross-sectional view taken along the line A–A' in FIG. 1A.

FIGS. 1A and 1B are diagrams showing a structure of a semiconductor device according to a first embodiment of the present invention, wherein FIG. 1A is a plan view and FIG. 1B is a cross-sectional view taken along the line A–A' in FIG. 1A.

First, an example of the structure of the semiconductor device according to the first embodiment will be described with reference to FIG. 1. The semiconductor device according to this embodiment is, for example, an IC tag, which comprises an upper substrate 12, an upper electrode (bump or the like) 13, a first conductor (metal or the like) 14, a wireless IC chip 16, a lower electrode (bump or the like) 17, a second conductor (metal or the like) 18, and a lower substrate 19, etc.

The first conductor 14 adheres to the upper substrate 12, and the second conductor 18 adheres to the lower substrate 19. The wireless IC chip 16, having the upper electrode 13 and the lower electrode 17, is sandwiched between the first conductor 14 and the second conductor 18. Also, the first conductor 14 and the second conductor 18 constitute an antenna.

The first conductor 14 and the second conductor 18 are connected at a conductor-connection portion 20, thereby being set to the same potential. Since impedance supplied to the wireless IC chip 16 differs depending on a common potential connection position, an optimum connection position is selected. One upper electrode 13 and one lower electrode 17 are preferably provided on the front surface and the rear surface of the wireless IC chip, respectively, and thereby this case can certainly ensure an electrode area larger than if a plurality of electrodes are provided even when the size of the wireless IC chip 16 is reduced.

The wireless IC chip 16 receives, via wireless, the energy supplied from the antenna, which is constituted by the first conductor 14 and the second conductor 18, and performs data transmission/reception via wireless. Two terminals from the wireless IC chip 16 are sufficient to connect it to an antenna terminal, and the wireless IC chip 16 is characterized in that it has the terminals extending from the front and rear surfaces of the wireless IC chip 16. By adopting above constitution, it is possible to connect the antenna with a simple structure.

Figure 29:
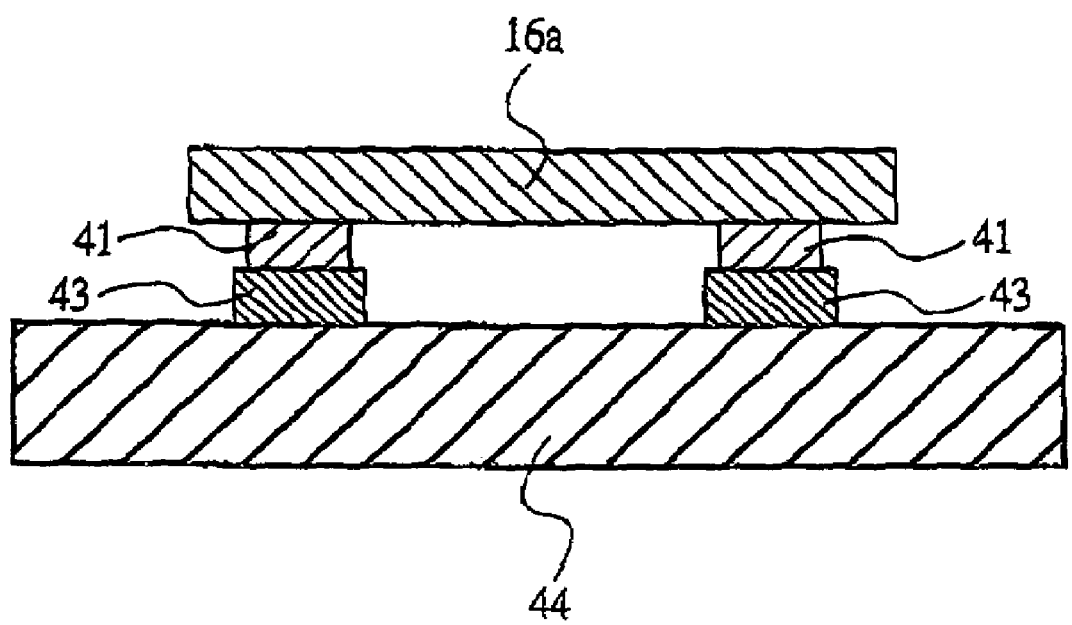
FIG. 29 is a cross-sectional view showing a structure of a semiconductor device that has been examined by the inventors as the premise of the present invention.

Also, in comparison with the conventional example shown in FIG. 29, there is no gap created between the wireless IC chip and the substrate. Therefore, the stress concentration on the wireless IC chip is reduced and the stress strength can be improved.

Also, the position of the wireless IC chip 16 is set within the range of several millimeters on the upper substrate 12 or the lower substrate 19 and so the precise alignment is unnecessary. This means that it is possible to mount a plurality of wireless IC chips in a batch manner, thereby allowing for economically forming the IC tag.

FIGS. 2A to 2D are diagrams showing manufacturing steps of the semiconductor device according to the first embodiment. FIGS. 2A to 2D are cross-sectional views taken along the line A–A' in FIG. 1A.

The semiconductor device according to the first embodiment is manufactured through, for example, the steps shown in FIGS. 2A to 2D.

Figure 2A:
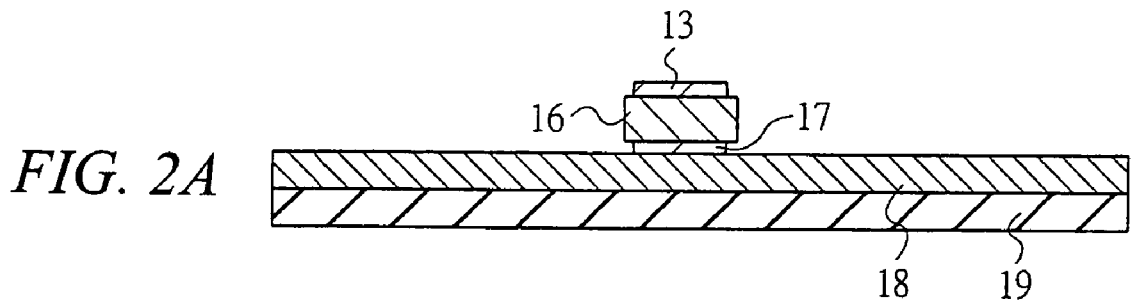
FIG. 2A is a diagram showing manufacturing steps of a semiconductor device according to a first embodiment of the present invention and is a cross-sectional view taken along the line A–A' in FIG. 1A.

FIG. 2A is a cross-sectional view showing the state just after a step of mounting the wireless IC chip 16 on the lower substrate 19 and the second conductor 18.

Figure 2B:
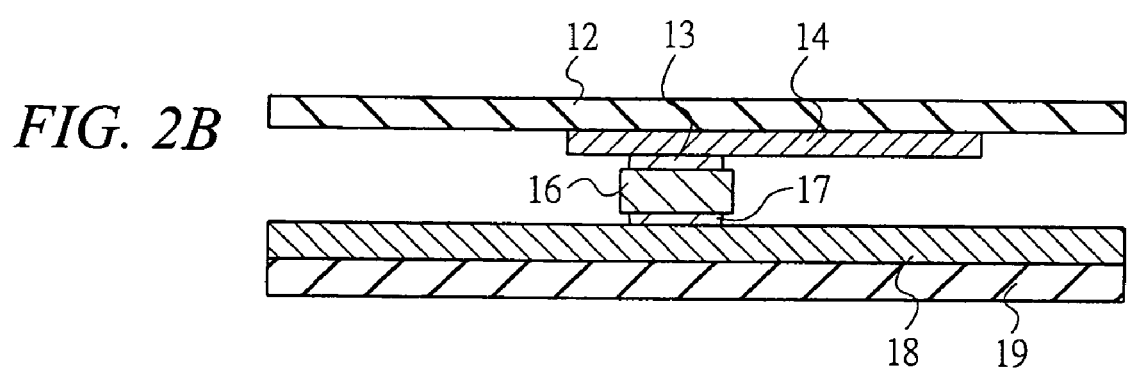
FIG. 2B is a diagram showing manufacturing steps of a semiconductor device according to a first embodiment of the present invention and is a cross-sectional view taken along the line A–A' in FIG. 1A.

FIG. 2B is subsequently a cross-sectional view showing the state just after a step of covering the wireless IC chip 16 with the upper substrate 12 and the first conductor 14.

Figure 2C:
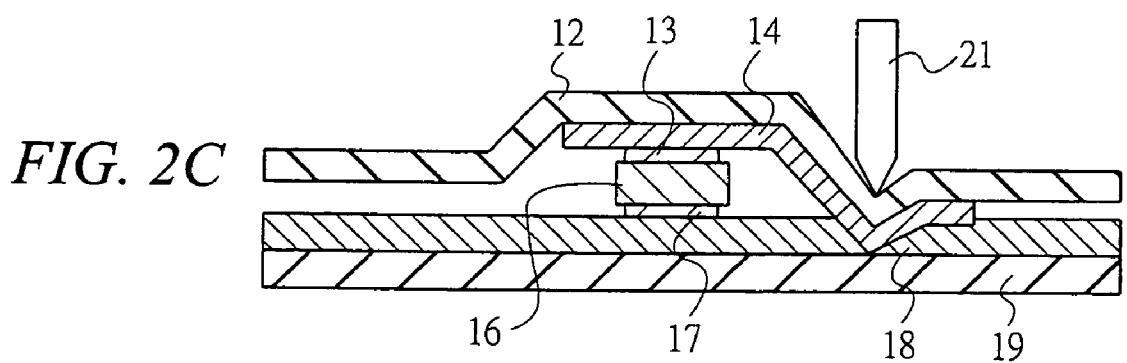
FIG. 2C is a diagram showing manufacturing steps of a semiconductor device according to a first embodiment of the present invention and is a cross-sectional view taken along the line A–A' in FIG. 1A.

FIG. 2C is subsequently a cross-sectional view showing the state just after a step of pressing the first conductor 14 to the second conductor 18 with a press pin 21.

Figure 2D:
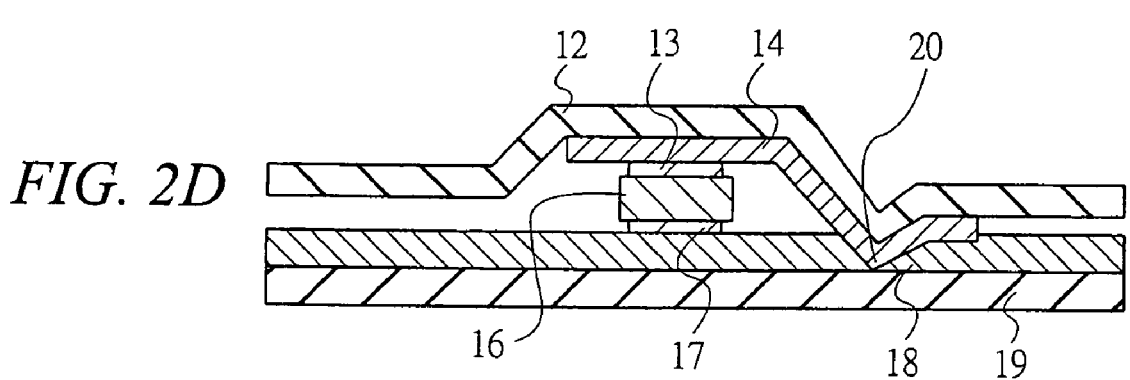
FIG. 2D is a diagram showing manufacturing steps of a semiconductor device according to a first embodiment of the present invention and is a cross-sectional view taken along the line A–A' in FIG. 1A.

FIG. 2D is a cross-sectional view showing the structure of the completed wireless IC tag.

It is effective to use an anisotropic conductive adhesive in connecting the conductors and the electrodes, etc. The anisotropic conductive adhesive can be used to attach the upper and lower substrates and to prevent unused portions of the upper and lower conductors from short-circuiting.

Additionally, at the time of using aluminum material as the antenna pattern, since the surface of the aluminum material is naturally oxidized, it is effective to contain, in the anisotropic conductive adhesive, such particles as nickel particles capable of breaking a film.

Note that a material of the conductor may use a metal plate, metal foil, conductive paste material, or the like made of copper, aluminum, silver, tin, and zinc, etc. as a raw material.

(Second Embodiment)

FIGS. 3 to 6 are plan views showing a structure of a semiconductor device according to a second embodiment of the present invention.

Figure 3:
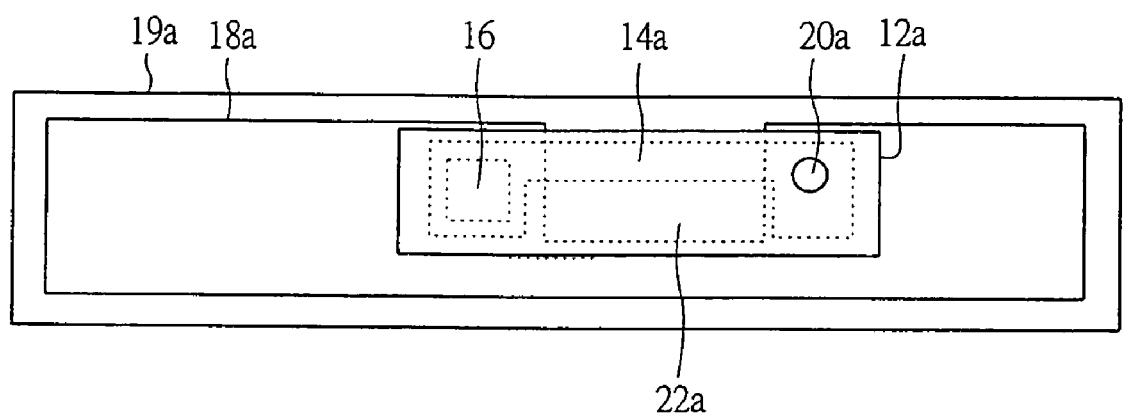
FIG. 3 is a plan view showing a structure of a semiconductor device according to a second embodiment of the present invention.

First, an example of the structure of the semiconductor device according to the second embodiment will be described with reference to FIG. 3. The semiconductor device according to the second embodiment is, for example, an IC tag, which includes an upper substrate 12a, an upper electrode (not shown), a first conductor 14a, a wireless IC chip 16, a lower electrode (not shown), a second conductor 18a, and a lower substrate 19a, etc.

The first conductor 14a adheres to the upper substrate 12a, and the second conductor 18a adheres to the lower substrate 19a. The wireless IC chip 16 with the upper electrode and the lower electrode is sandwiched between the first conductor 14a and the second conductor 18a. The first conductor 14a and the second conductor 18a are electrically connected via a conductor-connection portion 20a. Also, the first conductor 14a and the second conductor 18a constitute an antenna.

The sectional structure and the component materials are almost identical to those of the first embodiment (FIG. 1B). The IC tag according to the second embodiment is characterized in that there exists a gap such as a slit 22a between the first conductor 14a and the second conductor 18a when viewed two-dimensionally.

The slit 22a is a slit necessary to match the impedance of the wireless IC chip and the antenna. The impedance matching is not sufficiently achieved in the absence of the slit 22a, and so the energy from the antenna cannot efficiently be obtained. Therefore, the reduction of the communication distance is caused. The slit 22a has a width of 0.1 mm or larger and a length of 0.1 mm or larger.

Figure 4:
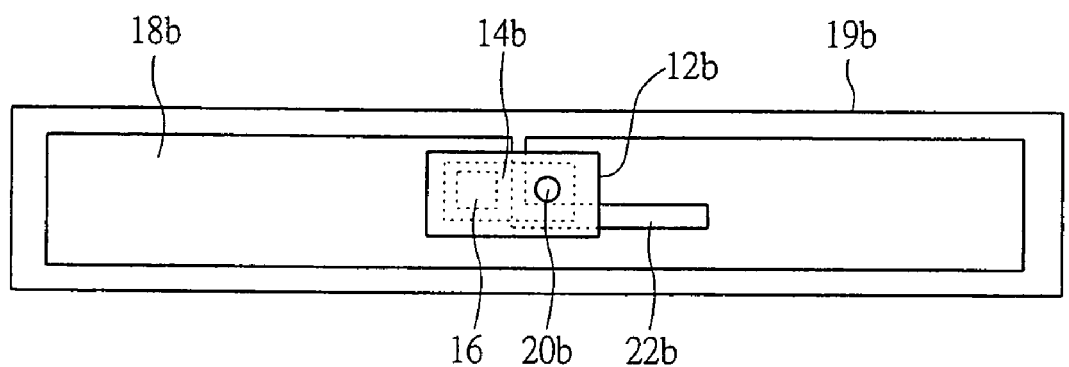
FIG. 4 is a plan view showing a structure of a semiconductor device according to a second embodiment of the present invention.

Next, FIG. 4 shows the structure of the IC tag in which the shapes of the first conductor 14a and the second conductor 18a are modified. In the IC tag shown in FIG. 4, the first conductor 14b has a rectangular shape, and a slit 22b exists in the second conductor 18b having a rectangular shape.

Figure 5:
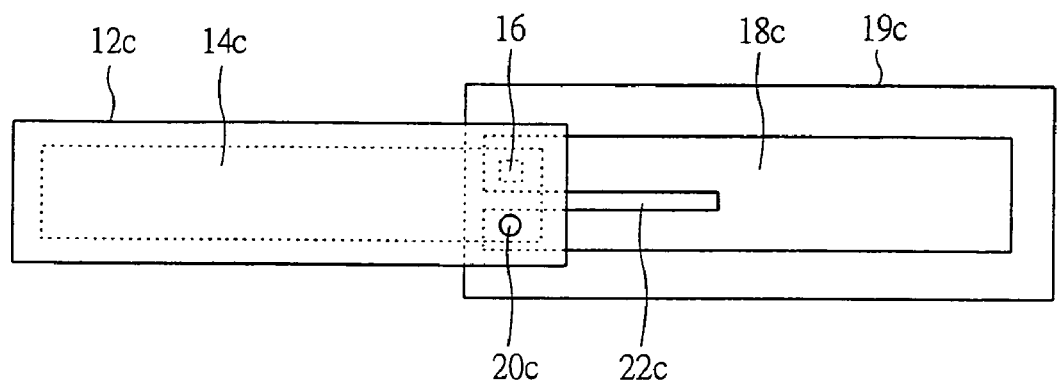
FIG. 5 is a plan view showing a structure of a semiconductor device according to a second embodiment of the present invention.

Subsequently, FIG. 5 shows the structure of the IC tag in which the shapes and the planar structures of the first conductor 14b and the second conductor 18b, etc. are modified. In the IC tag shown in FIG. 5, the first conductor 14c has a rectangular shape, and a slit 22c exists in the second conductor 18c having a rectangular shape. The first conductor 14c and the second conductor 18c are arranged so that their centers are offset from each other. Additionally, the upper substrate 12c and the lower substrate 19c are also arranged so that their centers are offset from each other. Also, the conductor-connection portion 20c between the first conductor 14c and the second conductor 18c is formed vertically to each longitudinal direction of the substrate and the conductor. When microwaves are used as a carrier, the overall length of the antenna is about 1 mm to 120 mm.

Figure 6:
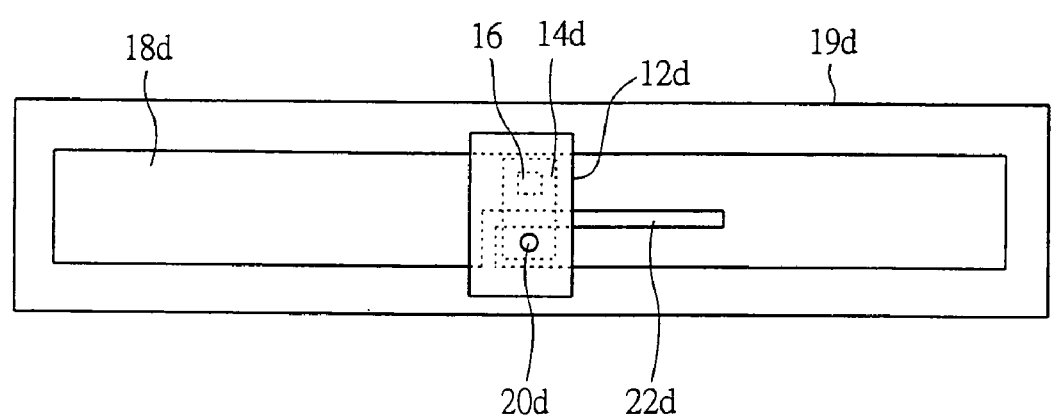
FIG. 6 is a plan view showing a structure of a semiconductor device according to a second embodiment of the present invention.

Subsequently, FIG. 6 shows the structure of the IC tag in which the shapes and the planar structures of the first conductor 14b and the second conductor 18b are modified. In the IC tag shown in FIG. 6, the first conductor 14d has a rectangular shape, and a slit 22d exists in the second conductor 18d having a rectangular shape. Also, the conductor-connection portion 20d between the first conductor 14d and the second conductor 18d is formed vertically to each longitudinal direction of the substrate and the conductor. The overall length of the antenna is almost equal to that shown in FIG. 5.

The manufacturing method of the semiconductor device according to the second embodiment is identical to that of the first embodiment shown in FIG. 2.

Subsequently, an example of the method of simultaneously connecting the first and second conductors among the plurality of semiconductor devices will be described.

Figure 7A:
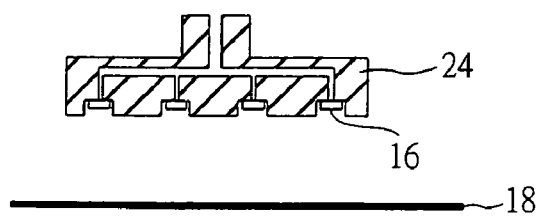
FIG. 7A is a diagram showing a step of simultaneously connecting first and second conductors of a plurality of semiconductor devices and is a cross-sectional view.
Figure 7B:
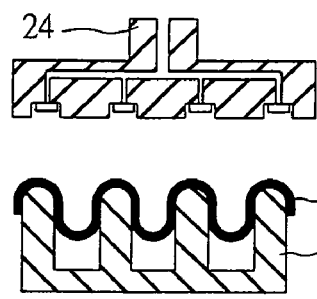
FIG. 7B is a diagram showing a step of simultaneously connecting first and second conductors of a plurality of semiconductor devices and is a cross-sectional view.
Figure 7C:
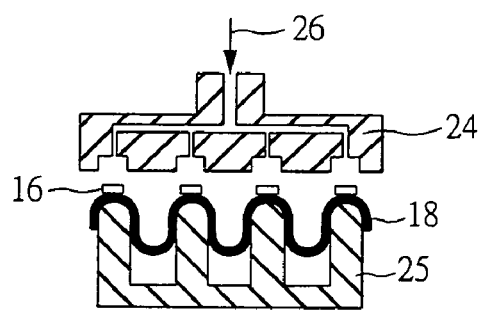
FIG. 7C is a diagram showing a step of simultaneously connecting first and second conductors of a plurality of semiconductor devices and is a cross-sectional view.
Figure 7D:
FIG. 7D is a diagram showing a step of simultaneously connecting first and second conductors of a plurality of semiconductor devices and is a front view.
Figure 7E:
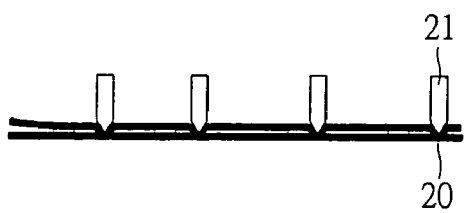
FIG. 7E is a diagram showing a step of simultaneously connecting first and second conductors of a plurality of semiconductor devices and is a front view.

FIGS. 7A to 7E are diagrams showing steps of simultaneously connecting the first and second conductors among the plurality of semiconductor devices. FIGS. 7A to 7C are cross-sectional views and FIGS. 7D and 7E are front views.

The first and second conductors are simultaneously connected and the antennas are formed, in the plurality of semiconductor devices through the steps shown in FIGS. 7A to 7E.

FIG. 7A shows the state where a vacuum absorber 24 absorbs the wireless IC chips 16.

FIG. 7B shows the state where a sheet-forming device 25 bends the second conductor 18 (18a to 18d). Since the antenna pattern generally has an elongated shape, it is possible to reduce a pitch for mounting the wireless IC chips by repeatedly folding the longitudinal side of the conductor 18 into a zigzag pattern.

FIG. 7C is a cross-sectional view showing the subsequent step. The vacuum absorber 24 is aligned with the sheet-forming device 25 and then attaches the wireless IC chips 16 onto the second conductor 18 (18A to 18D) by using air 26.

FIG. 7D is a cross-sectional view showing the subsequent step. The second conductor 18 (18a to 18d) is returned back to the flat state, and the first conductor 14 (14a to 14d) is aligned and placed thereon. Both surfaces of the wireless IC chip 16 are connected to the first conductor 14 (14a to 14d) and the second conductor 18 (18a to 18d) with the anisotropic conductive adhesive via electrodes.

FIG. 7E is a cross-sectional view showing the subsequent step. By pressing down the press pins 21 from above the first conductor 14 (14a to 14d), the first conductor 14 (14a to 14d) and the second conductor 18 (18a to 18d) are electrically connected to each other at the conductor-connection portion 20 (20a to 20d). According to the method described above, it becomes possible to simultaneously connect a plurality of antennas.

(Third Embodiment)

Figure 8A:
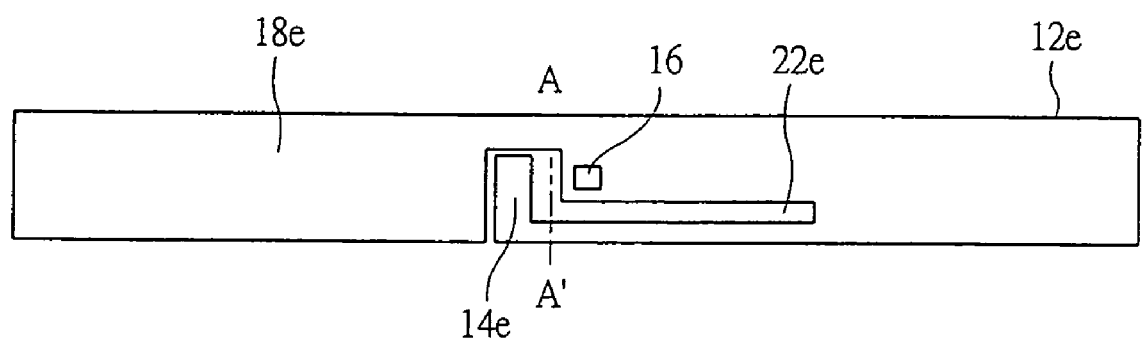
FIG. 8A is a plan view showing a structure of a semiconductor device according to a third embodiment of the present invention and shows the state before the fabrication.
Figure 8B:
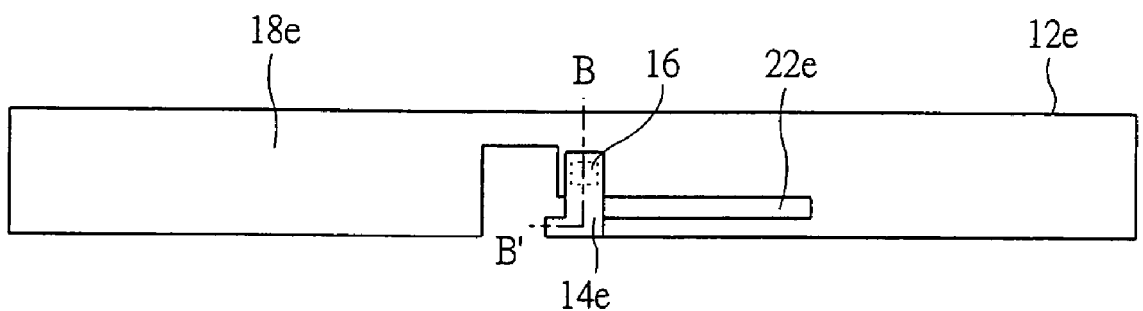
FIG. 8B is a plan view showing a structure of a semiconductor device according to a third embodiment of the present invention and shows the state after the fabrication.
Figure 9:
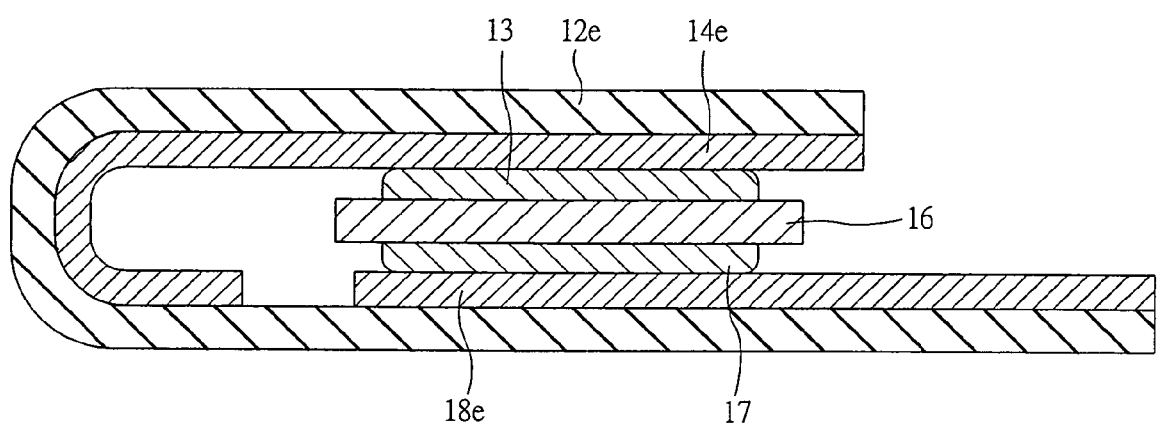
FIG. 9 is a cross-sectional view of taken along the line B–B' in FIG. 8B in a semiconductor device according to a third embodiment of the present invention.

FIGS. 8A and 8B are plan views showing a structure of a semiconductor device according to a third embodiment of the present invention. FIG. 8A shows the state before the fabrication, and FIG. 8B shows the state after the fabrication. FIG. 9 is a cross-sectional view taken along the line B–B' in FIG. 8B.

First, an example of the structure of the semiconductor device according to the third embodiment will be described with reference to FIGS. 8 and 9. The semiconductor device according to the third embodiment is, for example, an IC tag, which includes a substrate 12e, an upper electrode (not shown), a first conductor portion 14e, a wireless IC chip 16, a lower electrode (not shown), and a second conductor portion 18e, etc.

The conductor adheres to the substrate 12e. The wireless IC chip 16 with the upper electrode and the lower electrode is sandwiched between the first conductor portion 14e and the second conductor portion 18e (see FIGS. 8B and 9). The wireless IC chip 16 and the first conductor portion 14e are arranged at almost the center of the substrate 12e. Also, the conductor portions constitute the antenna.

In FIG. 8A, the wireless IC chip 16 with the electrodes is mounted on the second conductor portion 18e, thereby being in the form of connection. A slit 22e is provided in the second conductor portion 18e. Additionally, the first conductor portion 14e and the second conductor portion 18e are each maintained in the form of a rectangle shape.

In FIGS. 8B and 9, the first conductor portion 14e is bent along the line A–A', whereby the first conductor portion 14e and the upper electrode are in the form of connection. The overall length of the antenna is almost equal to that shown in FIG. 5. In this manner, it is possible to connect the antenna with a simple structure.

Figure 10A:
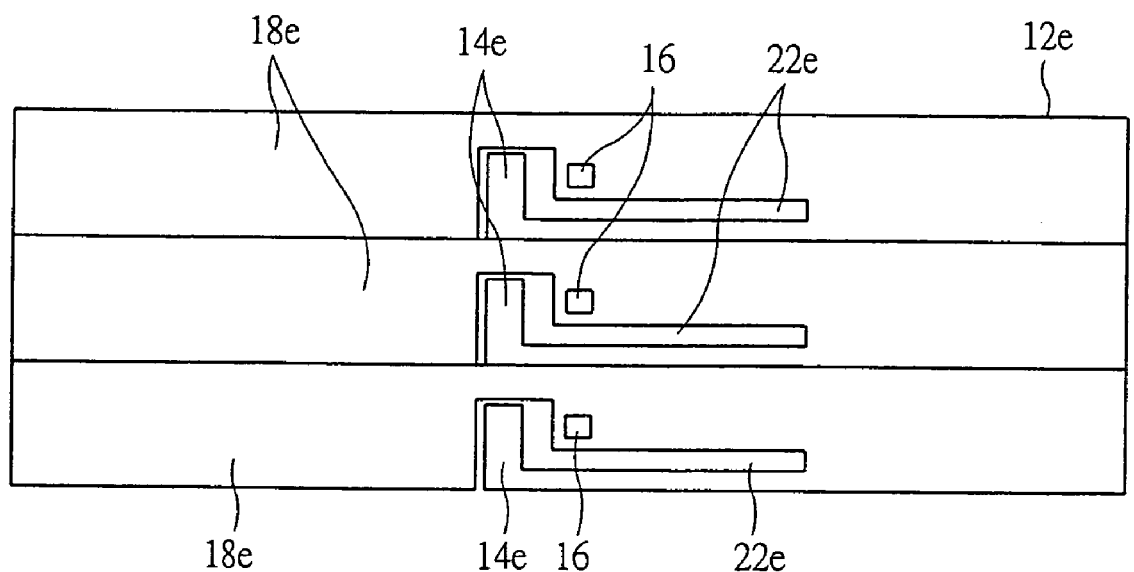
FIG. 10A is a plan view showing the state where a plurality of semiconductor devices according to a third embodiment of the present invention are connected and arranged and FIG. 10A shows the state before the fabrication.
Figure 10B:
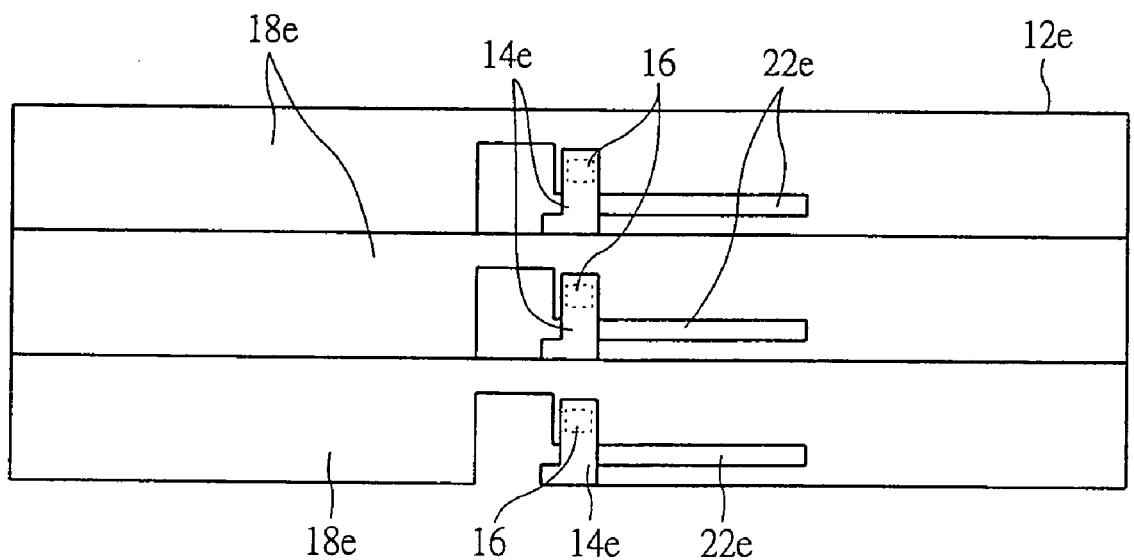
FIG. 10B is a plan view showing the state where a plurality of semiconductor devices according to a third embodiment of the present invention are connected and arranged and shows the state after the fabrication.

FIGS. 10A and 10B are plan views showing the state where a plurality of semiconductor devices according to the third embodiment are connected and arranged. FIG. 10A shows the state before the fabrication, and FIG. 10B shows the state after the fabrication.

FIGS. 10A and 10B each show the state where three IC tags are consecutively connected lengthwise. However, it is also possible to connect four or more IC tags. The first conductor portion 14e of each IC tag is maintained in the form of a rectangular shape, thereby allowing for consecutively arranging the antenna patterns with no waste of space.

Figure 11A:
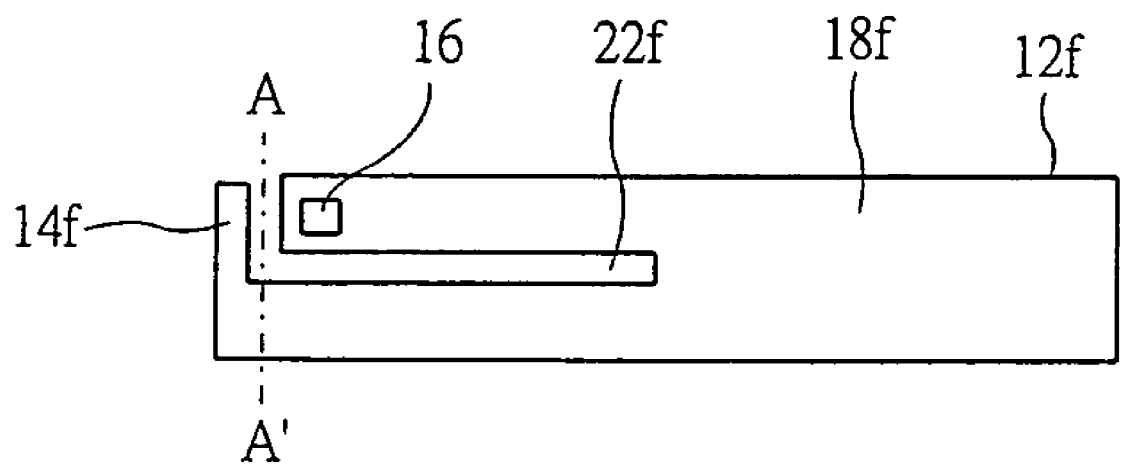
FIG. 11A is a plan view showing the structure of a semiconductor device according to a third embodiment of the present invention and shows the state before the fabrication.
Figure 11B:
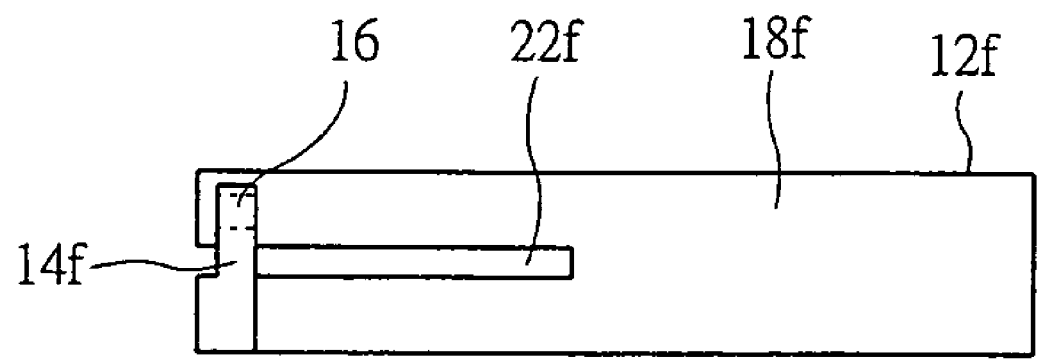
FIG. 11B is a plan view showing the structure of a semiconductor device according to a third embodiment of the present invention and shows the state after the fabrication.

FIGS. 11A and 11B each show the structure of the IC tag in which the shapes and the planar structures of the first conductor portion 14e and the second conductor portion 18e are modified. In the IC tag shown in FIGS. 11A and 11B, the conductor adheres to the substrate 12f. The wireless IC chip 16 with the upper electrode and the lower electrode is sandwiched between the first conductor portion 14f and the second conductor portion 18f (see FIG. 11B). The wireless IC chip 16 and the first conductor portion 14f are arranged at an end of the substrate 12f. The slit 22f is formed in the second conductor portion 18f. Also, the conductor constitutes the antenna.

In FIG. 11A, the wireless IC chip 16 with the electrodes is mounted on the second conductor portion 18f, thereby being in the form of connection. A bending portion is housed in the rectangular-shaped substrate 12f. After the wireless IC chip 16 is mounted on the second conductor portion 18f, the bending portion is bent along the line A–A'.

FIG. 11B is a plan view showing the structure after the first conductor portion 14f is bent. The first conductor portion 14f is connected to the upper electrode of the wireless IC chip 16 by bending the first conductor portion 14f. The overall length of the antenna is about half of that shown in FIG. 5.

Figure 12A:
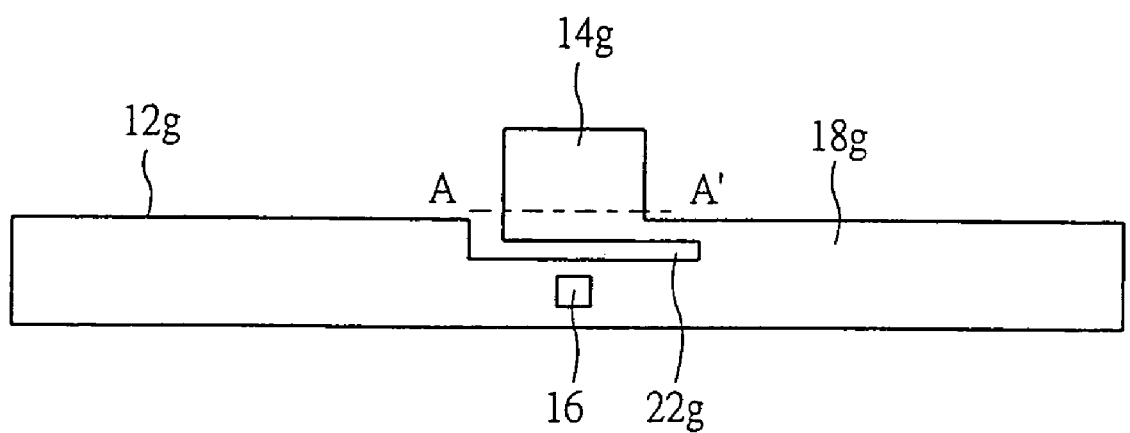
FIG. 12A is a plan view showing a structure of a semiconductor device according to a third embodiment of the present invention and shows the state before the fabrication.
Figure 12B:
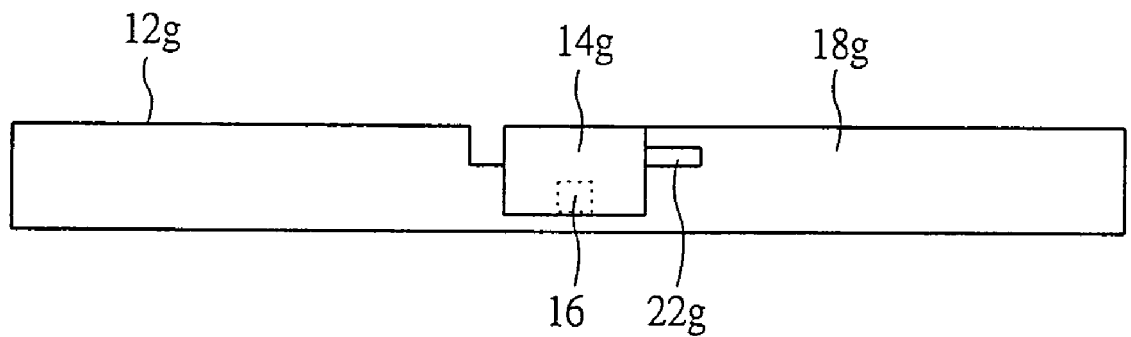
FIG. 12B is a plan view showing a structure of a semiconductor device according to a third embodiment of the present invention and shows the state after the fabrication.

FIGS. 12A and 12B each show the structure of the IC tag in which the shapes and the planar structures of the first conductor portion 14e and the second conductor portion 18e are modified. In the IC tag shown in FIGS. 12A and 12B, the conductor adheres to the substrate 12g. The wireless IC chip 16 with the upper electrode and the lower electrode is sandwiched between the first conductor portion 14g and the second conductor portion 18g (see FIG. 12B). The wireless IC chip 16 and the first conductor portion 14g are arranged at almost the center of the substrate 12g. The slit 22g is formed in the second conductor portion 18g. Also, the conductor constitutes the antenna.

In FIG. 12A, the first conductor portion 14g is formed like a protrusion and located at almost the center of the second conductor portion 18g. After the wireless IC chip 16 with the electrodes is mounted on the second conductor portion 18g, the first conductor portion 14g is bent along the line A–A'.

FIG. 12B is a plan view showing the state after the first conductor portion 14g is bent. The first conductor portion 14g is connected to the upper electrode of the wireless IC chip 16 by bending the first conductor portion 14g.

Figure 13:
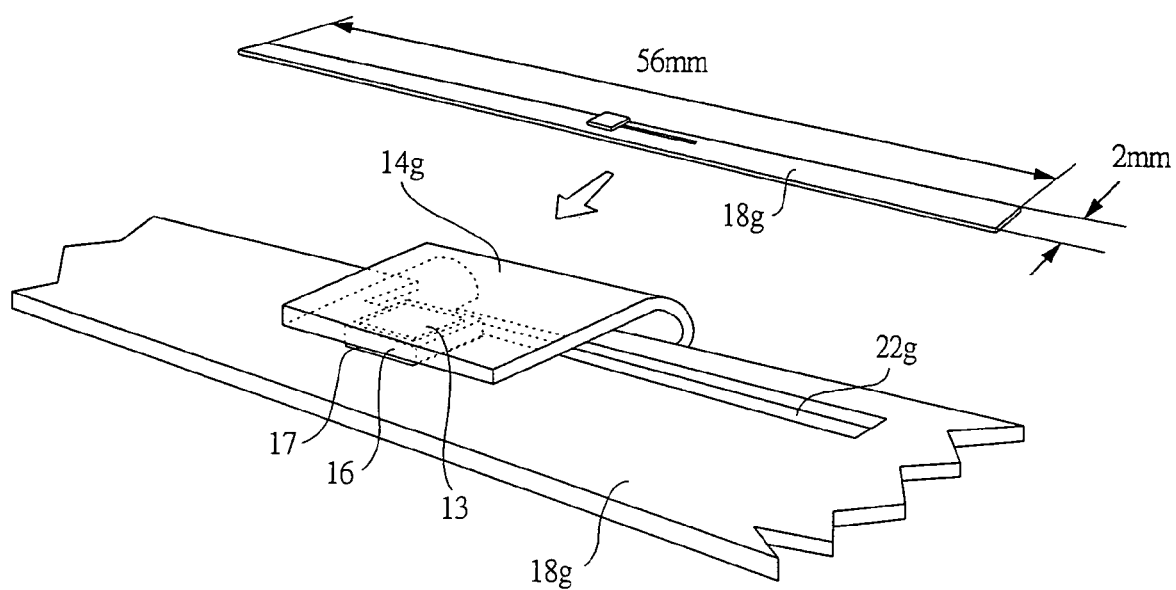
FIG. 13 is a perspective view showing a structure of a semiconductor device according to a third embodiment of the present invention.

FIG. 13 is a perspective view showing the structure of the semiconductor device according to the third embodiment. The second conductor portion 18g is a principle part of the antenna. The wireless IC chip 16 with the upper electrode 13 and the lower electrode 17 is sandwiched between the first conductor portion 14g and the second conductor portion 18g. The slit 22g is formed in the second conductor portion 18g. Since the first conductor portion 14g and the second conductor portion 18g can be formed by bending one conductor, it is possible to easily form them from one substrate.

Also, since the sandwich structure is used, its normal operation can be maintained even if the wireless IC chip 16 is turned upside down. Additionally, the normal operation can be maintained regardless of planar rotation of the wireless IC chip 16. As described above, the highly accurate alignment with the antenna is unnecessary in spite of the device having two terminals, thereby allowing for connecting the wireless IC chip and the antenna at extremely low cost.

In recent years, some problems have become apparent about the identification of an object by a barcode. One of the problems is the security-related problem. The recent advancement in a computer technology has caused the cost reduction and the resolution improvement in a scanner and a color printer. Additionally, even if the barcode number is the unique one, the color copy of the barcode can be formed simply and at low cost. With these copy technologies, it is possible to easily copy complicated patterns and highly detailed patterns. Further, it has become extremely difficult to decide whether the copied ones is true or false unless being compared to a real one with high accuracy. Technologically, even an expensive gift certificate and an equivalent of a cash voucher called a token can be counterfeited relatively easily. The number of crimes, in which these copy technologies are used, has been rapidly increasing.

The system employing the barcode is based on the printing. Accordingly, the attachment of the barcode to the object requiring security cannot prevent its counterfeit.

Next, another problem of the identification by the barcode is read properties of the reader. The system employing the barcode is a technology for optically identifying an object located nearby by using a laser or CCD (charge coupled device). Therefore, it is impossible to read the barcode when there is an obstacle between the reader and the barcode.

Also, there is the limitation in the angle between the barcode and the read direction, and so there is an angle therebetween, the proper reading cannot be done in some cases. Additionally, the system is extremely weak in dirt on the surface of the barcode, and even the slight dirt makes it impossible to read the barcode. Furthermore, in many cases, the reading cannot be appropriately performed in dark night, a dark place, and a narrow space, etc. Further, with respect to a rate of the reading, it is impossible to achieve the 100% reading rate, as evidenced by the repetitive reading performed frequently. This is fatal for such an application that cannot permit any reading error.

The next problem is the cost of the reader. Since the system employing the barcode is designed to optically read the barcode, a photosensitive device is required. Additionally, a device for irradiating laser is also necessary. The barcode reader capable of reading the barcode at various angles and with high reading rate sometimes requires the reader cost of several million yen. In the case of laying a large number of equipments, large amount of investment is needed. Motive force of the spread of the barcode system is that the barcode can be simply applied to the products by a printing technology. On the other hand, however, it can be said that the barcode system has been used in spite of these problems.

The wireless identification semiconductor device has the potential for solving these problems. More specifically, since its device itself is a semiconductor device, it has, in security, an excellent ability for the anti-counterfeit in comparison with the printing technology.

Also, since its identification is performed-wirelessly, it is not influenced by the angle of the object, dirt, obstacle, size, and the space, regarding the read properties of the reader.

Also, since the reader employ the wireless identification without using the photosensitive technology, it can be made one chip by the semiconductor manufacturing technology. Thereby, it becomes possible to manufacture the reader at low cost.

Problems of the wireless identification by the semiconductor device are the cost of the semiconductor device and the cost of the antenna connection. The cost of the semiconductor device can be infinitely reduced by reducing the size of the chip. When the size of the IC chip is reduced to a 0.15 mm square, it is possible to obtain 1.4 million IC chips from an 8-inch wafer.

Then, for the reduction of the fabrication cost that is the problem to be left, the inventors have made the invention in this application. In the semiconductor devices according to the first to third embodiments of the present invention, in order to provide one electrode to each of the front and rear surfaces of the wireless IC chip, the IC chip may be sandwiched by the conductors from its both surfaces. Thereby, the semiconductor device can be fabricated even if the IC chip is turned upside down. Accordingly, a large number of chips can be manufactured at once, thereby allowing for achieving the reduction in the cost.

A problem pending from conventionally in the wireless identification semiconductor device is the higher cost in comparison with the barcode. Since the barcode is a printed matter, it is possible to attach the barcode to the object at extremely low cost if it is produced by the repetitive printing. This is the prime reason why the barcode has become widespread. Additionally, various problems are pointed out in the barcode, but since there are extremely many kinds of the object, the slight cost increase causes enormous amount of money and so this is not relevant to a factor in substituting the barcode for the other one.

Meanwhile, the wireless identification semiconductor device has many advantages in comparison with the barcode, but it has not been used as a replacement of the barcode yet since the cost of the semiconductor device and the cost of the antenna connection are high.

The inventors suggest the technique necessary to exchange all the barcodes for the wireless identification semiconductor devices. For manufacturing the wireless identification semiconductor device at extremely low cost, it is necessary to reduce the size of the IC chip. For example, if the chip size is about a 0.05 mm square, twenty-eight million chips can be obtained from a 12-inch wafer. If one wafer can be manufactured by 280 thousand yen, the cost of one chip will become one-hundredth yen.

Accordingly, the problem of the cost of the semiconductor device can be solved by reducing the chip size of the semiconductor device. Also, if an aluminum foil is substituted for an antenna and thereby the antenna is made small, the problem of its cost can be solved.

The remaining problem is the cost for connecting the small IC chip to the antenna. To pick up the small chips one by one and align and connect them with and to the small electrodes causes the cost increase due to the requirement for high precision of the equipment and the reduction of a production throughput, and thus it is not suitable for the mass production. Consequently, there occurs a limitation in the reduction of the cost.

Therefore, the inventors suggest the wireless IC chip providing each one electrode on the front and rear surfaces of the chip. Also, in order to connect the wireless identification semiconductor device to the external antenna, the impedance matching becomes necessary and therefore at least two terminals are required. Conventionally, it has been necessary to arrange these two terminals on the front surface of the chip. When the chip size is reduced, the size of the electrode and the space therebetween become extremely small and a very advanced technique is required to align and connect the antenna with and to the electrode. This will affect not only the increase of prices of the semiconductor device but also the reliability of the wireless identification semiconductor device.

Advantages of the semiconductor device according to the first to third embodiments of the present invention are to provide each one electrode on the front and rear surfaces of the chip. This makes it possible to use the whole of one surface as an electrode. For example, even if the size of the chip is a 0.05 mm square, the electrode can have the size of a 0.05 mm square. It can be said that the size of such electrode is sufficiently large in the current technology.

Since the wireless identification semiconductor device can obtain energy and signals through the electromagnetic wave, there is no polarity of the electrodes on the front and rear surfaces of the wireless IC chip. Therefore, since each electrode does not have plus or minus polarity, properties of the wireless identification semiconductor device, having the electrodes on its both surfaces, and of its circuit configuration are not particularly affected even if the wireless IC chip is turned upside down and assembled in connecting the chip and the antenna.

In this manner, a conventional method of picking the IC chips one by one with the vacuum pincette and aligning them becomes unnecessary. Therefore, it becomes possible to simultaneously handle a large number of wireless IC chips, simultaneously align the wireless IC chips, and mount them on the antenna substrate at once.

At this time, in order to form the wireless IC chip into a flat plate, the thickness of the wireless IC chip must be smaller than the planar dimension thereof. This is because the electrodes on both surfaces and the antenna cannot form a sandwich structure when the wireless IC chip has a cube shape or cuboid shape.

The representative one among the negotiable certificates is a banknote, and the banknote will be used in the future without a doubt. It is true that to deal with the cash is troublesome, but the usefulness of the banknote is not likely to be impaired in view of the confidentiality and the flexibility of the cash until the infrastructure for the electronic money is established.

For this reason, it is expected that the banknote will be used for several decades from now. However, there are limitations in improving the effects of anti-counterfeit only by the printing technology of the banknote from the viewpoint of the recent advancement of a scanner technology and a copy technology. Since the banknote is utilized around the world, the credible anti-counterfeit technology is desired in order to achieve the monetary stabilization. It is desired that the anti-counterfeit technology is manufactured at a lower price and has the effect of the anti-counterfeit and its high reliability.

For its achievement, the wireless identification technology employing a small semiconductor device is utilized. The small chip incorporating an antenna is also suitable to be used in this field. However, the chip, provided with an external antenna, is easier to handle for getting the communication distance and the like. To improve the reliability thereof, the stress strength etc. is increased by reducing the chip size and providing the electrode bumps on both sides.

For putting, into the banknote, the wireless IC chip with an antenna, there are various problems to be solved. One of them is about a price. There is a limitation in the anti-counterfeit done by the printing technology. However, the printing technology has the advantage of a low price. Additionally, though a hologram etc. is also counterfeited easily, it is used frequently due to its low price. It is necessary to remove the obstacle of price for putting the wireless IC chip into the banknote.

Subsequently, the next one is about the reliability. In the case of putting the wireless IC chip into paper, there is the severe restriction that breakage of the chip and its bad connection must be avoided in every condition of the paper being used.

The next one is about the thickness of the paper. Generally, some papers as well as banknotes are frequently stacked on. Even in such case, the thickness of the stacked papers is needed to be uniform, not in the form of protrusion. The semiconductor device according to the first to third embodiments provides techniques capable of solving these problems.

Firstly, as to the price of the first problem, the chip size is reduced and a low cost material such as aluminum etc. is used and the assembly thereof is done en bloc, whereby allowing for the low cost manufacture.

Regarding the reliability of the second problem, the stress strength against the bending and the shock, etc. can be improved by reducing the chip size. Also, it is possible to form the large electrodes by providing each one electrode on both surfaces of the chip. Additionally, the thickness of each electrode is increased, thereby allowing for further increasing the stress strength.

As to the thickness of the third problem, according to the structure of the semiconductor device in the first to third embodiments, it is possible to form the wireless identification semiconductor device with an antenna, which is thinned to the utmost limit. For example, when the thickness of the wireless IC chip is 10 μm and that of the antenna conductor is 10 μm, the total thickness of the 10 μm thick wireless IC chip+the 10 μm thick upper antenna+the 10 μm thick upper antenna becomes 30 μm. Assuming that the thickness of the banknote at the completion is set to 100 μm by using such total thickness, it is easy to complete the banknote with a sufficiently flat shape. Since the banknotes are produced by using a paper-making process in many cases, the IC chips are incorporated therein during the process and then each banknote is formed into a flat shape. Since the IC chip has sufficient stress strength, water can be also drained by a calendar process etc. Therefore, according to the semiconductor device according to the first to third embodiments of the present invention, the IC chips can be incorporated in the banknote at low cost and with high reliability, and the banknote incorporating the IC chips can be formed into a flat shape. Additionally, if the total thickness, including the IC chip, from the outer surface of the first conductor to the outer surface of the second conductor is 100 μm or smaller, it is also possible to put such IC chip between papers, which have the pasted portions or hollowed portions therein.

(Fourth Embodiment)

Figure 14:
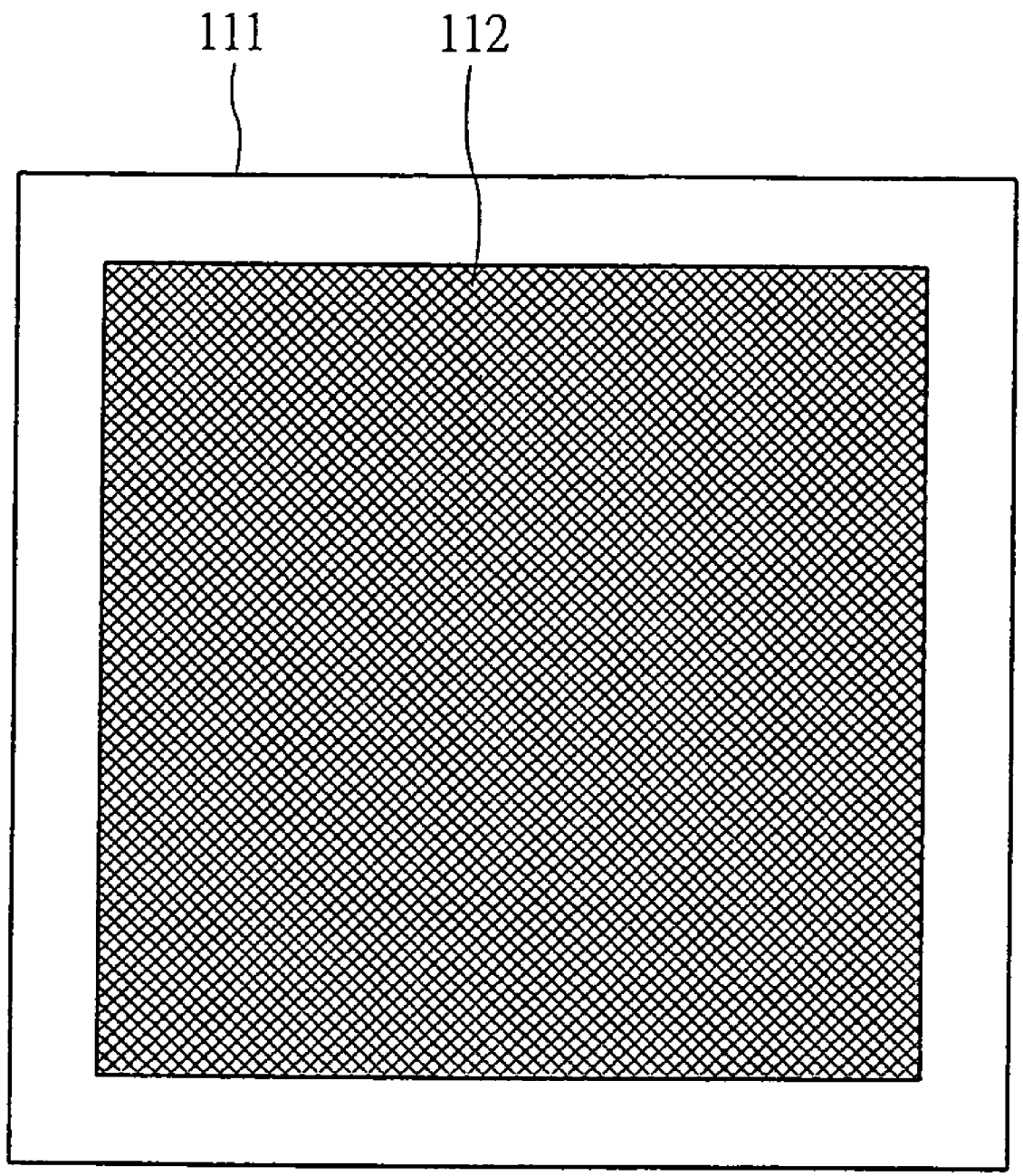
FIG. 14 is a plan view showing a structure of an alignment jig of a wireless IC chip according to a fourth embodiment of the present invention.

FIG. 14 is a plan view showing the structure of a alignment jig of wireless IC chips according to a fourth embodiment of the present invention.

A alignment jig 111 for the wireless IC chips 16 is provided with a plurality of chip absorb holes 112. The plurality of wireless IC chips 16 are scattered on the alignment jig 111. Initially, the wireless IC chips 16 are randomly placed. After a certain period of time while a slight vibration and a vacuum absorbing function, etc. are used, each one wireless IC chip 16 is housed in each of the chip absorb holes. The surplus wireless IC chips 16 are housed in other container. The aligned wireless IC chips 16 can be simultaneously mounted on the antenna patterns prepared separately. The diagram in FIG. 14 showing the alignment jig 111 corresponds to the plan view of the vacuum absorber shown in FIG. 7. In the case of the conventional wireless IC chips each having a plurality of connection terminals on one surface, the simultaneous alignment as mentioned above is impossible and therefore there must adopt a method of distinguishing the front and rear sides of the IC chips to mount and connect the chips.

(Fifth Embodiment)

Figure 15A:
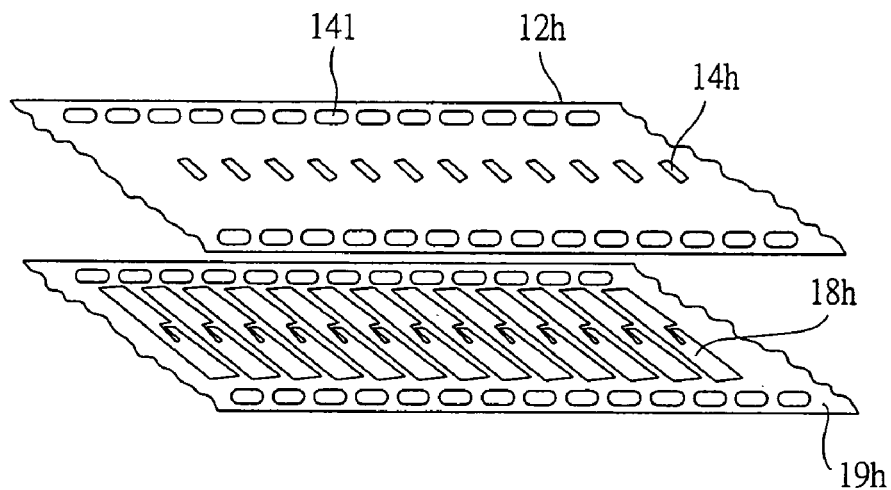
FIG. 15A is a plan view showing a structure of a semiconductor device according to a fifth embodiment of the present invention and shows the state before the fabrication.
Figure 15B:
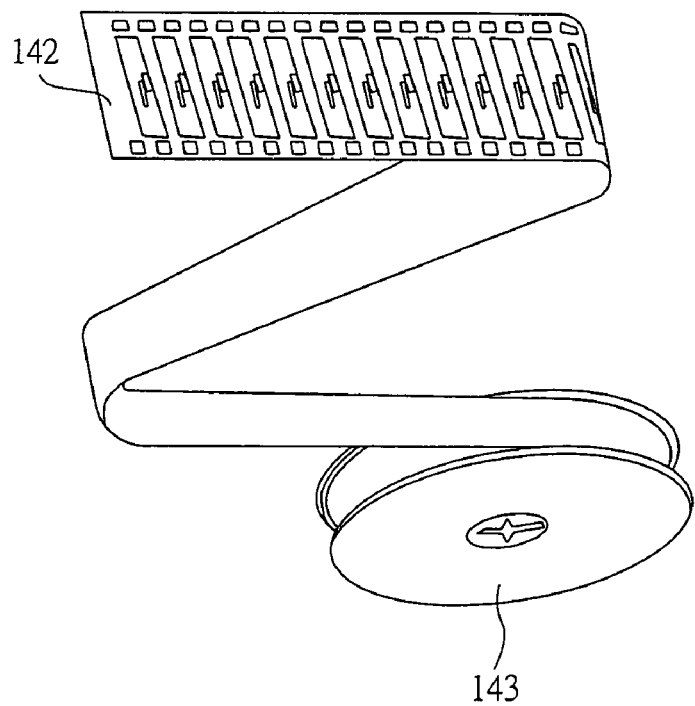
FIG. 15B is a plan view showing a structure of a semiconductor device according to a fifth embodiment of the present invention and shows the state after the fabrication.

FIGS. 15A and 15B are diagrams showing the structure of a semiconductor device according to a fifth embodiment of the present invention, and FIG. 15A shows the state before the fabrication, and FIG. 15B shows the state after the fabrication.

The semiconductor device according to a fifth embodiment is one, for example, in which the semiconductor devices according to the first to third embodiments are successively connected and formed into a tape shape.

In FIG. 15A, sprocket holes 141 are formed in the tape, on which a plurality of upper substrates 12h are arranged, and first conductors 14h are attached thereto. Further, the sprocket holes 141 are formed also in the tape, on which a plurality of lower substrates 19h are arranged, and second conductors 18h are attached thereto.

FIG. 15B shows a laminated tape 142 obtained by sandwiching the IC chip with the upper and lower electrodes, between the upper substrate 12h and the lower substrate 19h. The tape 142 is wound around a reel 143.

Using the structure as described above, when the wireless identification semiconductor devices are attached to various objects, the reel and the tape with the sprocket holes are employed, thereby allowing for easily handling the wireless identification semiconductor devices.

(Sixth Embodiment)

Figure 16:
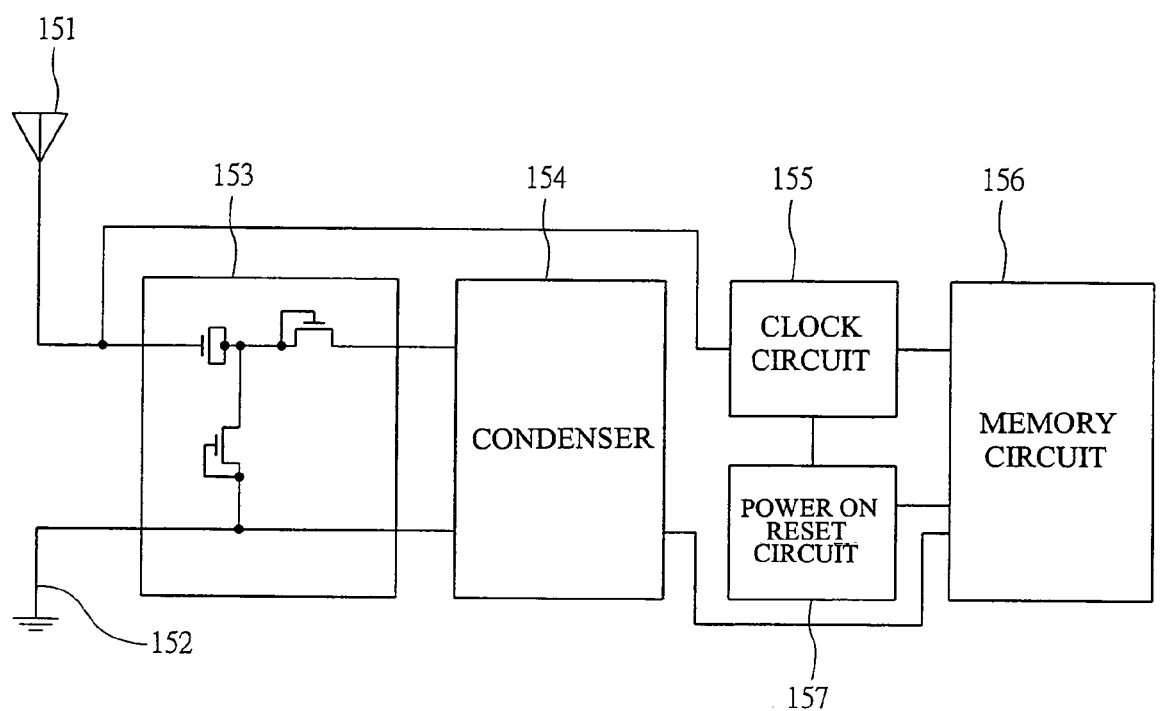
FIG. 16 is a block diagram showing a circuit configuration of a semiconductor device according to a sixth embodiment of the present invention.

FIG. 16 is a block diagram showing the circuit configuration of a semiconductor device according to a sixth embodiment of the present invention.

An example of the circuit configuration of the semiconductor device according to the sixth embodiment will be described with reference to FIG. 16. The semiconductor device according to the sixth embodiment is, for example, an IC tag, which includes an antenna 151, a rectifier circuit 153, a condenser 154, a clock circuit 155, a power on reset circuit 157, a memory circuit 156, and the like.

The antenna 151 and a ground point 152 exist as a pair. The electromagnetic wave inputted through the antenna is rectified in the rectifier circuit 153 to generate the DC (Direct Current) voltage. Charges corresponding to this voltage are accumulated in the condenser 154.

The clock circuit 155 functions to extract clocks from the signals sent together with the electromagnetic wave.

The power on reset circuit 157 receives the clock signals and sets the initial value of the memory circuit 156.

The memory circuit 156 includes a counter, a decoder, a memory cell storing memory information, a writing circuit, and the like.

These digital circuits are operated in synchronization with the clock signal. The clock signal is generated by demodulating the signal obtained by modulating the electromagnetic wave. An ASK method modulated by amplitude, a FSK method modulated by frequency, a PSK method modulated by phase, or the like are available as a modulation method. The combination method of them is also available. A condenser and a diode are provided in the rectifier circuit 153, whereby an alternating waveform is rectified into a direct waveform.

Figure 30:
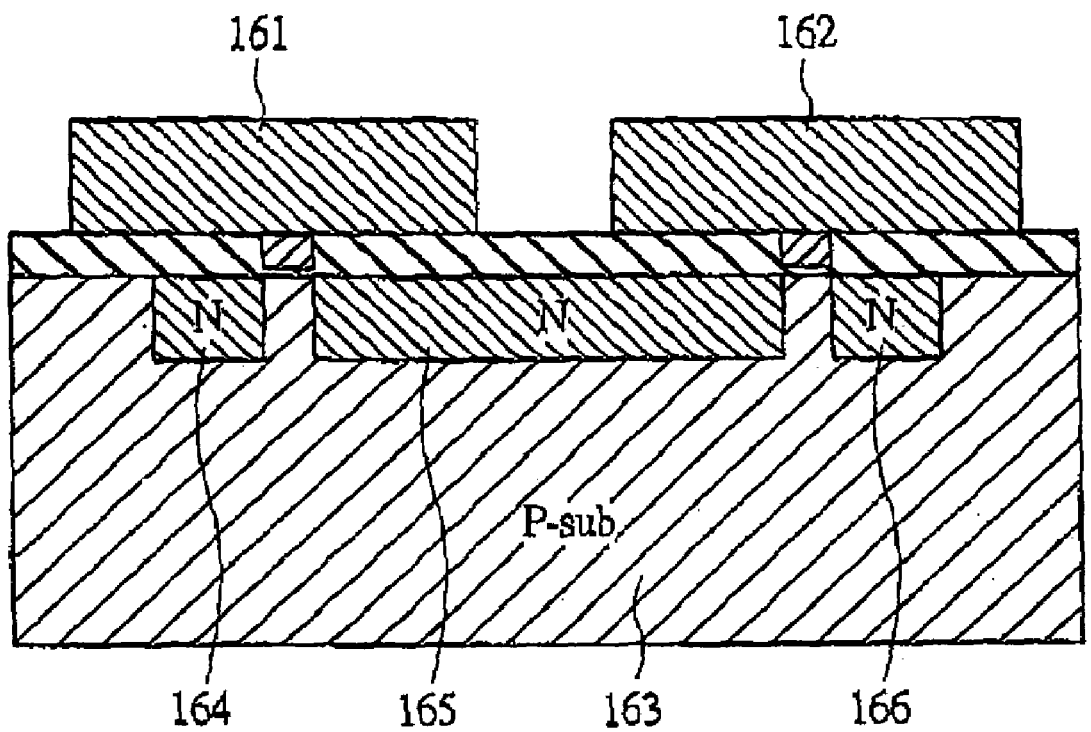
FIG. 30 is a cross-sectional view showing a device structure of an input portion of a full-wave rectifier circuit according to a technique that has been examined by the inventors as the premise of the present invention.

FIG. 30 is a cross-sectional view showing the device structure of an input portion of a conventional full-wave rectifier circuit, for the comparison with the present invention.

In the input portion of the conventional full-wave rectifier circuit, a first electrode 161 and a second electrode 162 are provided on the surface of the device and are respectively connected to the gate of a MOS transistor. There are a first diffusion portion 164, a second diffusion portion 165, and a third diffusion portion 166 in a silicon substrate 163. In the full-wave rectifier circuit, terminal portions, to which the electromagnetic wave is inputted, are constituted as a circuit with a similar shape thereto. These two input terminals are connected to the gates of the two transistors. Therefore, it is necessary to form two transistors on the surface of the silicon substrate and also to take the electrodes from the same surface of the chip. Consequently, the silicon substrate is different from the electrodes in potential and cannot make a short circuit with these electrodes. Additionally, if the electrodes are not taken from the same surface of the silicon substrate, the antenna cannot be mounted thereon.

Since the conventional structure thereof has the defects as described above, the following structure is adopted in the invention of this application.

Figure 17:
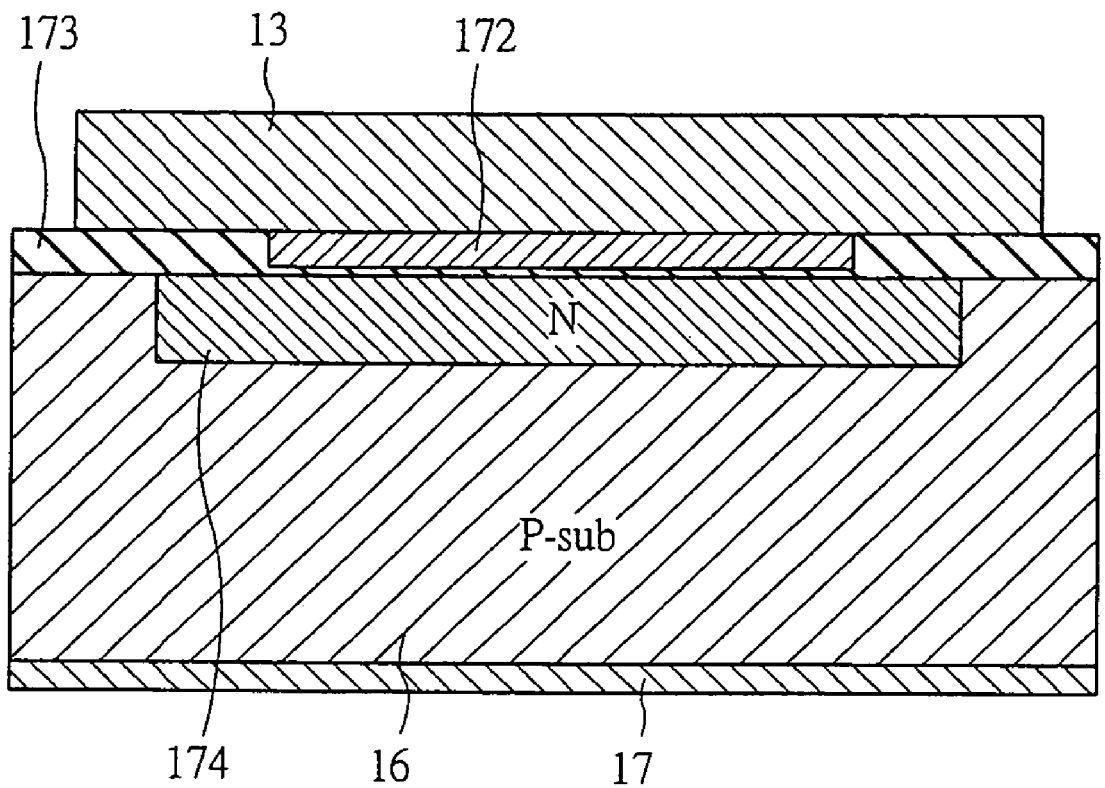
FIG. 17 is a cross-sectional view showing a device structure of an input portion of a double voltage rectifier circuit in a semiconductor device according to a sixth embodiment of the present invention.

FIG. 17 is a cross-sectional view showing the device structure of an input portion of a double voltage rectifier circuit in the semiconductor device according to the sixth embodiment of the present invention.

The input portion of the double voltage rectifier circuit of the semiconductor device according to the sixth embodiment forms, for example, a condenser, and includes the upper electrode 13, poly silicon 172, an oxide film 173, a condenser diffusion portion 174, the lower electrode 17 and the like. The poly silicon 172 is connected to the upper electrode 13. The wireless IC chip 16 and the upper electrode 13 are insulated from each other by an oxide film.

Also, the condenser diffusion portion 174 may be used as an electrode for forming a condenser via the oxide film. Since the condenser is formed on the silicon substrate, the silicon substrate can be set to be a ground terminal. In the double voltage rectifier circuit, the formation of the circuit into a similar shape becomes unnecessary and the substrate potential can be fixed to the ground. Thereby, the electrode can be taken out as the antenna terminal from the rear surface of the silicon substrate.

Of course, the electrode can be also taken out from the front surface of the device. However, as the chip size is reduced to, for example, a 0.5 mm square, a 0.3 mm square, a 0.15 mm square, a 0.1 mm square, a 0.05 mm square, and a 0.01 mm square, the space for taking out two electrodes from the same surface becomes narrow. When the plurality of electrodes are taken from the narrow space, each size of the electrodes is reduced and the space between the electrodes lessens. Accordingly, the connection with the antenna becomes extremely difficult.

Since the wireless IC chip functions by the electromagnetic wave, the wireless IC chip is well characterized in that energy is supplied to the wireless IC chip to transmit/receive data. Therefore, a circuit for processing the electromagnetic wave, a memory circuit, and a circuit for controlling these circuits are provided in the wireless IC chip.

First, in the circuit for processing the electromagnetic wave, since the electromagnetic wave has an alternating waveform, a rectifier circuit for converting the alternating waveform into a direct waveform is used. In general, there are two kinds of the rectifier circuit, that is, a full-wave rectifier circuit and a double voltage rectifier circuit. In the full-wave rectifier circuit, a substrate potential becomes different from the input of the wireless IC chip. Meanwhile, in the double voltage rectifier circuit, the substrate potential can be used also as the input of the wireless IC chip.

Consequently, the rear surface of the wireless IC chip, having a potential equal to the potential of the substrate, can be used also as an electrode. Although the substrate of the wireless IC chip is classified into a P type and an N type, a double voltage rectifier circuit can be formed even by the substrate of any types.

Also, though the rear surface potential is floated in the case of a SOI (Silicon On Insulator) wafer, it is possible to expose and connect an active surface by removing the silicon and the oxide film on the rear surface.

Next, a circuit for changing the input impedance of the wireless IC chip is incorporated in the above-mentioned rectifier circuit. When the input impedance is changed, there is an unmatched occurrence between the antenna impedance and the impedance of the semiconductor device and a change in reflectance is caused. The change in reflectance is read by the reader and it becomes possible to perform the reception of information in the reader side.

Next, with respect to the memory circuit, the memory circuit operated by the low voltage is required. The memory device is formed so that one memory is made of one device, for the purpose of reducing its area. Further, the memory address counter is decoded and the memory of an object is selected. By designing the overall memory to be a circuit capable of performing charge and discharge, the memory can be operated without carrying always a current, thereby allowing for largely reducing its power consumption. The control circuit mentioned below can be also used for the information writing in the memory circuit. However, for reducing the size of the memory, if such memory is constituted as a ROM (Read Only Memory) to write the information with an electron bean writing system, the size of the memory circuit can be minimized. Also, the numbering with high reliability and without any duplication can be realized.

Next, the control circuit will be described. The control circuit has functions to control a memory output, extract clock information from the electromagnetic wave, reduce the maximum voltage by controlling a power supply voltage, and set the initial state by using the power on reset circuit.

The clock circuit demodulates the clock signal modulated in the electromagnetic wave. The demodulated clock signal is sent to the memory circuit. By the clock signal, the memory address counter is operated and the memory output is controlled.

The power on reset circuit is a circuit for sending a reset signal during the increase of the power supply voltage. The power on reset circuit is used to prevent the state of the counter from being instable during the time when the power supply voltage is increased from 0 V.

Additionally, a limiter of the power supply voltage is a protection circuit for preventing the circuit breakage from occurring due to the excessive voltage applied to the circuit in the wireless IC chip when the wireless IC chip is located near the reader and the extremely large energy is applied.

By setting the substrate potential to be common to the terminal input of the wireless IC chip by the use of the circuit as described above, the rear surface of the wireless IC chip can be used as the electrode.

(Seventh Embodiment)

Figure 18:
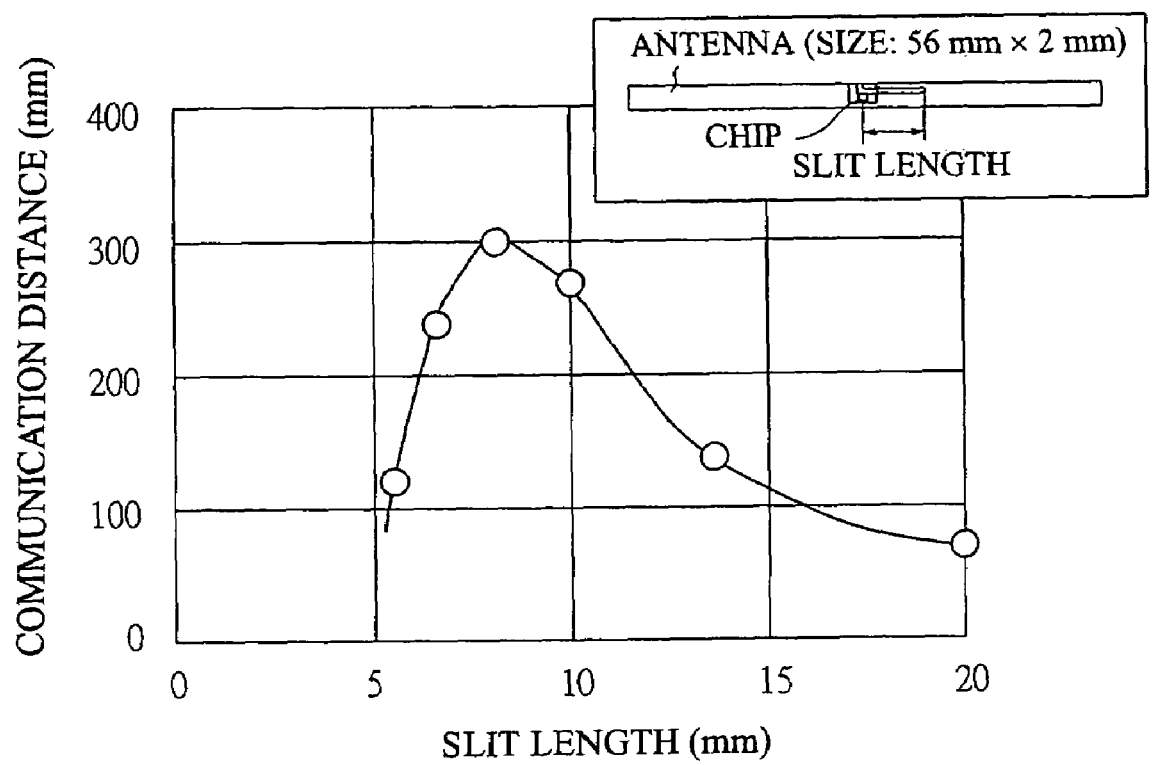
FIG. 18 is a graph showing the relationship between a communication distance of a wireless identification semiconductor device and a slit length in a seventh embodiment of the present invention.

FIG. 18 is a graph showing the relationship between a communication distance of a wireless identification semiconductor device and a slit length according to a seventh embodiment of the present invention.

In FIG. 18, the horizontal axis represents the slit length in the antenna and the vertical axis represents the communication distance from the reader thereto. It can be understood from FIG. 18 that there is the condition under which the communication distance lengthens maximally. This means that the matching between the input impedance of the wireless IC chip and the impedance of the antenna can be adjusted by the slit length.

In the antenna, in which the electrode are provided on each of both surfaces of the wireless IC chip, the phenomenon that the optimum point for the communication distance occurs depending on the slit length is a phenomenon unique to the microwave, and when the frequency is varied, the other phenomenon occurs. For example, when the frequency is 13.56 MHz, the communication distance is varied depending on the value of the external condenser. This means that the matching with the impedance of the wireless IC chip can be obtained depending on the outer shape of the wireless IC chip, thereby bringing about the effect of expanding the effective scope of the invention in this application.

Figure 19:
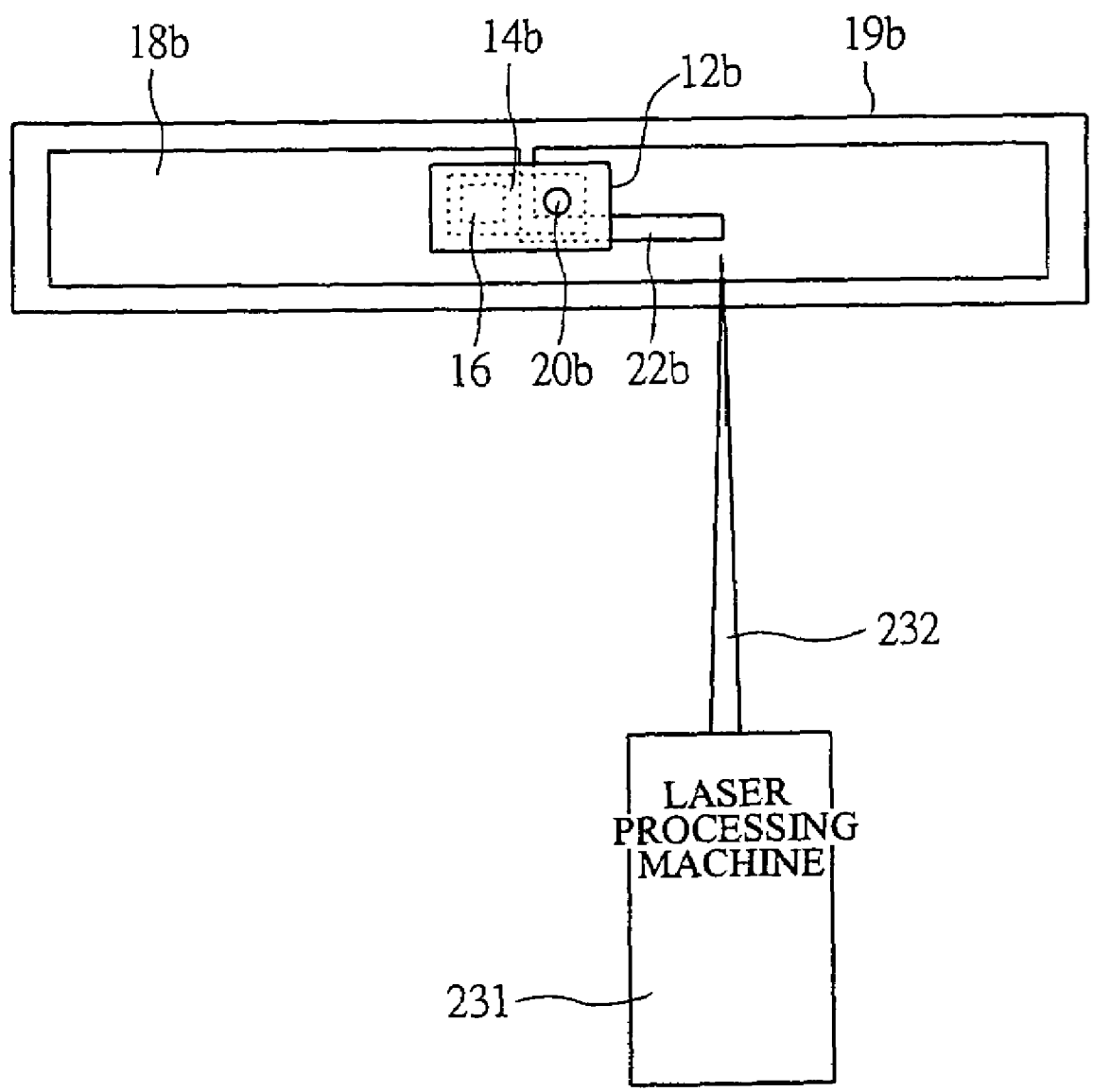
FIG. 19 is an explanatory diagram showing a method of achieving the impedance matching in a wireless identification semiconductor device in a seventh embodiment of the present invention.

FIG. 19 is an explanatory diagram showing a method of achieving an impedance matching in the wireless identification semiconductor device according to the seventh embodiment of the present invention.

An example of the method of achieving the impedance matching of the wireless identification semiconductor device will be described with reference to FIG. 19.

For example, a laser beam 232 is irradiated from a laser processing machine 231 to the slit 22b in the second conductor 18b of the semiconductor device described in the first to third embodiments. Then, the shape of the slit 22b is adjusted by the laser beam 232.

As shown in FIG. 18, the communication distance of the semiconductor device can be adjusted by changing the length of the slit 22b. Since the input impedance of the wireless IC chip 16 is determined depending on the condition of the semiconductor process, its variation occurs.

Therefore, the variation in the process can be corrected by adjusting the length of the slit 22b in the first conductor 14b or the second conductor 18b of the semiconductor device by the use of a processing machine such as the laser processing machine 231 etc.

(Eighth Embodiment)

FIG. 20 is a cross-sectional view showing manufacturing steps of a semiconductor device according to an eighth embodiment of the present invention.

An example of the manufacturing method for a semiconductor device according to the eighth embodiment will be described with reference to FIG. 20. Each semiconductor device according to the first to third embodiments described above is manufactured through the steps shown in FIGS. 20A to 20D.

Figure 20A:
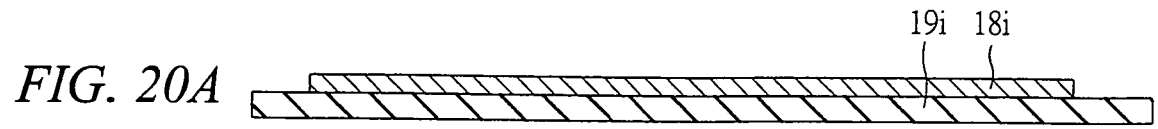
FIG. 20A is a cross-sectional view showing manufacturing steps for a semiconductor device according to an eighth embodiment of the present invention.

FIG. 20A shows the state where a second conductor 18i is arranged on a lower substrate 19i.

Figure 20B:
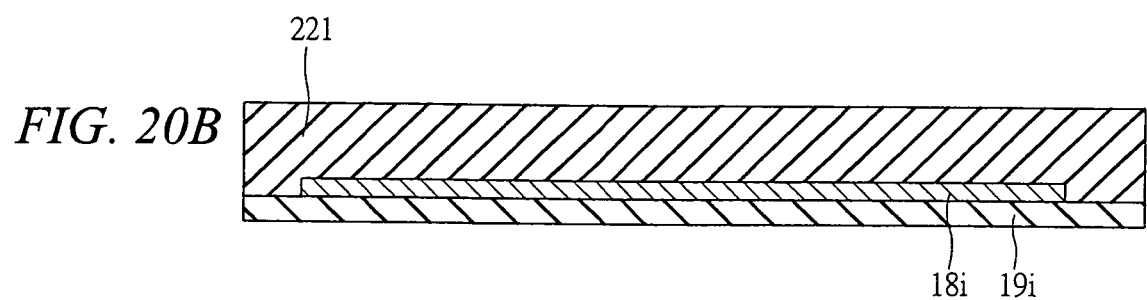
FIG. 20B is a cross-sectional view showing manufacturing steps for a semiconductor device according to an eighth embodiment of the present invention.

FIG. 20B is a cross-sectional view showing the subsequent step of FIG. 20A in which the state just after applying adhesive 221 to the surface of the second conductor 18i is shown.

Figure 20C:
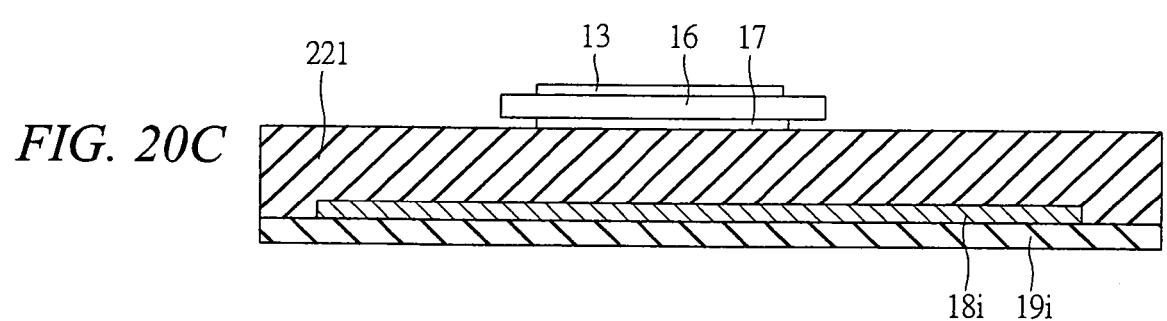
FIG. 20C is a cross-sectional view showing manufacturing steps for a semiconductor device according to an eighth embodiment of the present invention.

FIG. 20C is a cross-sectional view showing the subsequent step of FIG. 20B in which the state just after the wireless IC chip 16 with the upper electrode 13 and the lower electrode 14 is arranged on the adhesive 221 is shown.

Figure 20D:
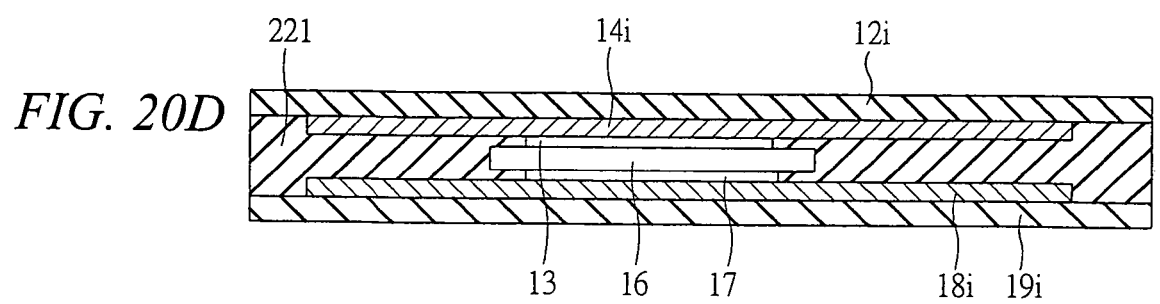
FIG. 20D is a cross-sectional view showing manufacturing steps for a semiconductor device according to an eighth embodiment of the present invention.

FIG. 20D is a cross-sectional view showing the subsequent step of FIG. 20C in which the state just after the first conductor 14i on the upper substrate 12i is pressed and joined to the wireless IC chip 16 is shown.

Anisotropic conductive adhesive or non-conductive adhesive is used as the adhesive 221. These adhesives are used not only to join the IC chip and the conductor but also to attach the first and second conductors. With this method, it is possible to manufacture the IC tag economically.

(Ninth Embodiment)

FIG. 21 is a cross-sectional view showing manufacturing steps of a semiconductor device according to a ninth embodiment of the present invention.

An example of the manufacturing method for the semiconductor device according to the ninth embodiment will be described with reference to FIG. 21. The semiconductor device according to the first to third embodiments is manufactured through the manufacturing steps shown in FIG. 21A to 21E.

Figure 21A:
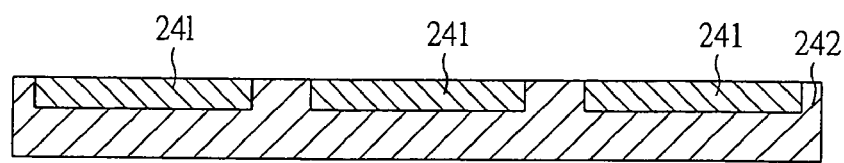
FIG. 21A is a cross-sectional view showing manufacturing steps for a semiconductor device according to a ninth embodiment of the present invention.

FIG. 21A is a cross-sectional view showing the state where a plurality of device layers 241 are arranged on the surface of the semiconductor substrate (semiconductor wafer) 242 made of silicon.

Figure 21B:
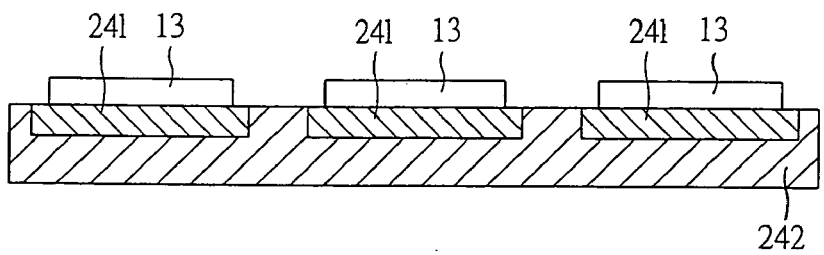
FIG. 21B is a cross-sectional view showing manufacturing steps for a semiconductor device according to a ninth embodiment of the present invention.

FIG. 21B is a cross-sectional view showing the subsequent step of FIG. 21A in which the state just after the step of forming the upper electrodes 13 is shown.

Figure 21C:
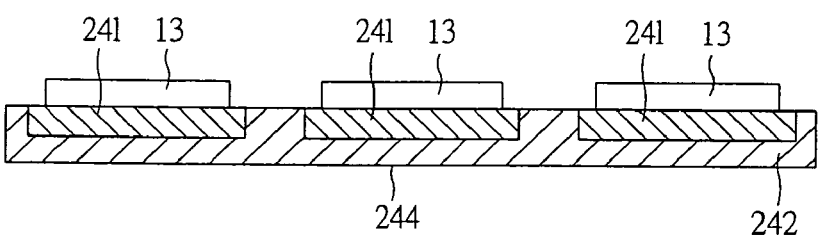
FIG. 21C is a cross-sectional view showing manufacturing steps for a semiconductor device according to a ninth embodiment of the present invention.

FIG. 21C is a cross-sectional view showing the subsequent step of FIG. 21B in which the state just after the step of grinding a backside of the semiconductor substrate 242 is shown. The surface 244 formed by the backside grind is exposed.

Figure 21D:
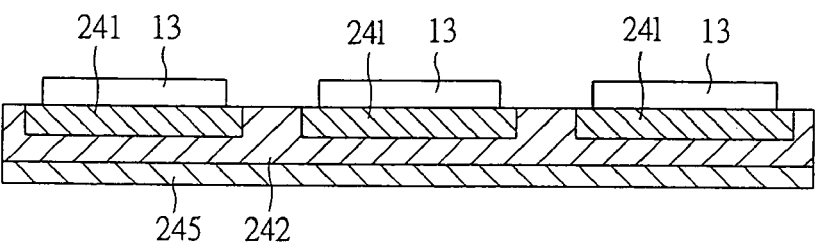
FIG. 21D is a cross-sectional view showing manufacturing steps for a semiconductor device according to a ninth embodiment of the present invention.

FIG. 21D is a cross-sectional view showing the subsequent step of FIG. 21C in which the state just after the step of forming a backside-deposit layer on the surface 244 formed by the backside grind is shown.

Figure 21E:
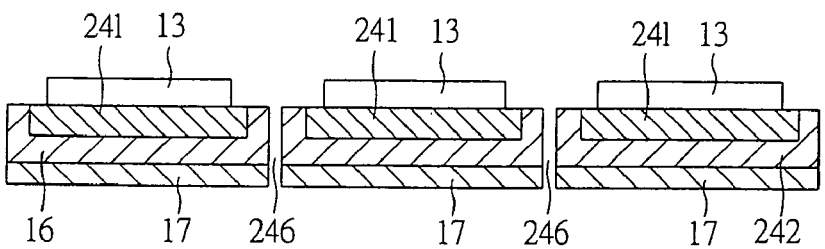
FIG. 21E is a cross-sectional view showing manufacturing steps for a semiconductor device according to a ninth embodiment of the present invention.

FIG. 21E is a cross-sectional view showing the subsequent step of FIG. 21D in which the state just after the step of forming chip-separation portions 246 by a dicing or laser is shown.

As described above, the electrode on the rear surface is formed after grinding the backside opposite to the front surface of the wafer, thereby allowing for fabricating the thin wireless IC chip having the electrodes on both surfaces.

Figure 22:
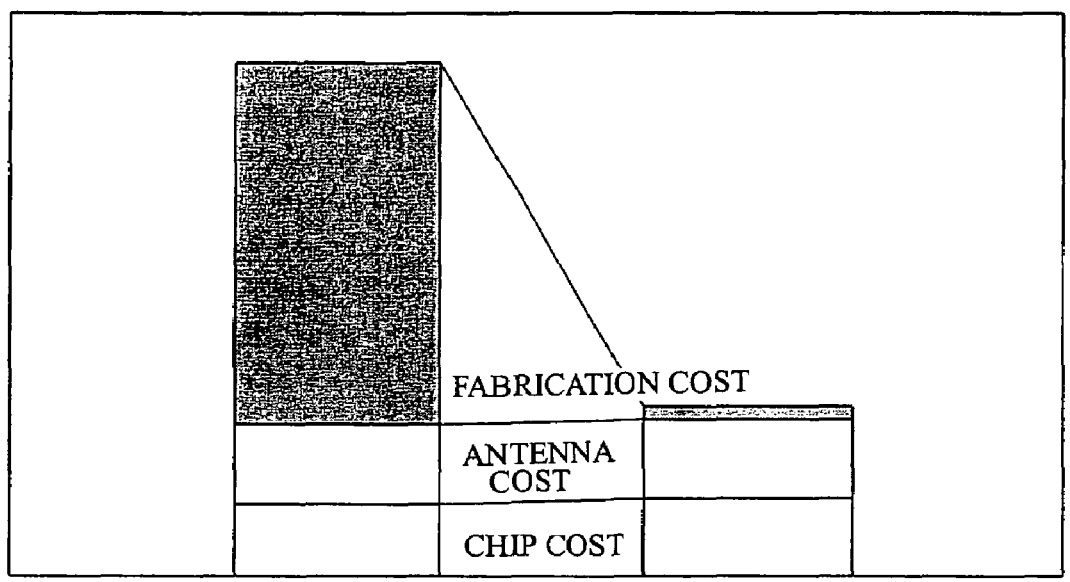
FIG. 22 is a graph showing the cost comparison between a conventional wireless identification semiconductor device and a wireless identification semiconductor device according to the present invention.

FIG. 22 is a graph showing a cost comparison between the conventional wireless identification semiconductor device and the wireless identification semiconductor device according to the present invention of this application. FIG. 22 apparently shows the effect of the present invention of this application. The wireless identification semiconductor device is also called as an IC tag, and its low price is strongly demanded since it is used at any purposes. A cost structure of the IC tag is very simple and is composed of the chip cost, the antenna cost, and the fabrication cost as shown in FIG. 22. The chip cost and the antenna cost are thought to be determined depending on the area size. However, as each size of the chip and the antenna is reduced, the high-precision alignment technique and the handling technique are required. Accordingly, the device structure becomes complicated, and the price increase of the device and the decrease of the productivity occur. Also, the reduction of the fabrication cost of the IC tag reaches its limit. For its solution, the method of reducing the fabrication cost, similarly to this invention, is required. In order to improve the productivity with a simple device, it is necessary to make the high-precision alignment unnecessary and to fabricate a large number of products at once. By using the wireless IC chip having an electrode on both surfaces, it is possible to fabricate 100×100 chips in 10 seconds or less.

(Tenth Embodiment)

Figure 23:
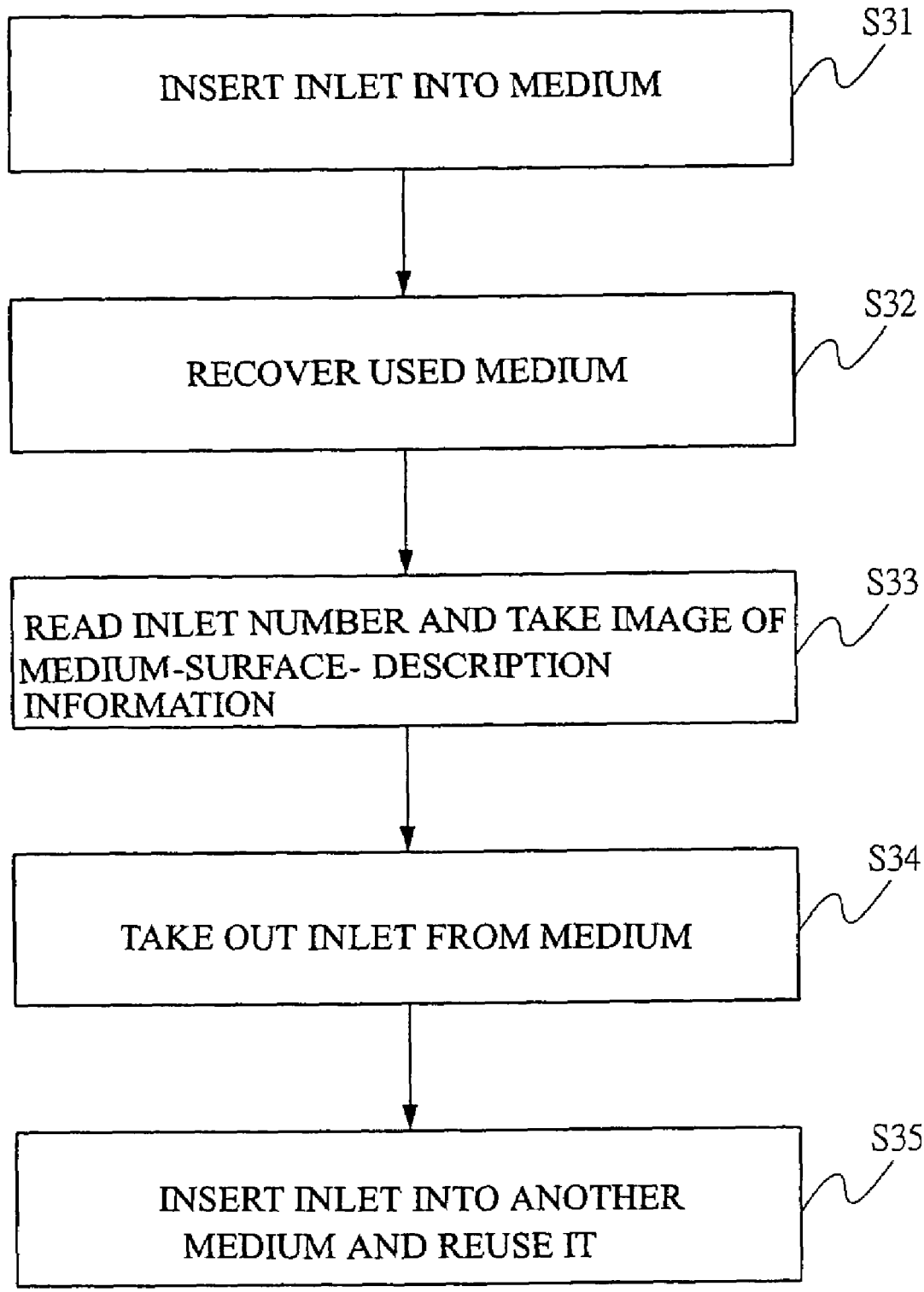
FIG. 23 is a flow chart showing a method of reusing a IC tag according to a tenth embodiment of the present invention.

FIG. 23 is a flow chart showing a method of reusing the IC tag according to a tenth embodiment of the present invention.

The tenth embodiment describes a method of economically using the wireless IC tag. First, an inlet (formation for insertion), on which the wireless IC tag is mounted, is inserted into a medium, for example, a paper, plastic or the like (step S31). Next, the used medium is recovered (step S32). At this time, recorded information such as date, amount of money, name, place, and the other properties etc. are described on this medium as occasion demands. Next, the inlet number is read and the image of medium-surface-description information is taken (step S33). Then, the inlet is taken out from the medium (step S34), and is inserted into another medium and thereby is reused (step S35). A flag is applied to the inlet number in a server to show its reuse.

In this manner, the wireless IC tag, which has been thrown away after use, can be efficiently used as many times as possible, thereby being available economically. Such concept is available not only for the wireless IC tag but also for the conventional IC card or the like.

(Eleventh Embodiment)

Figure 24:
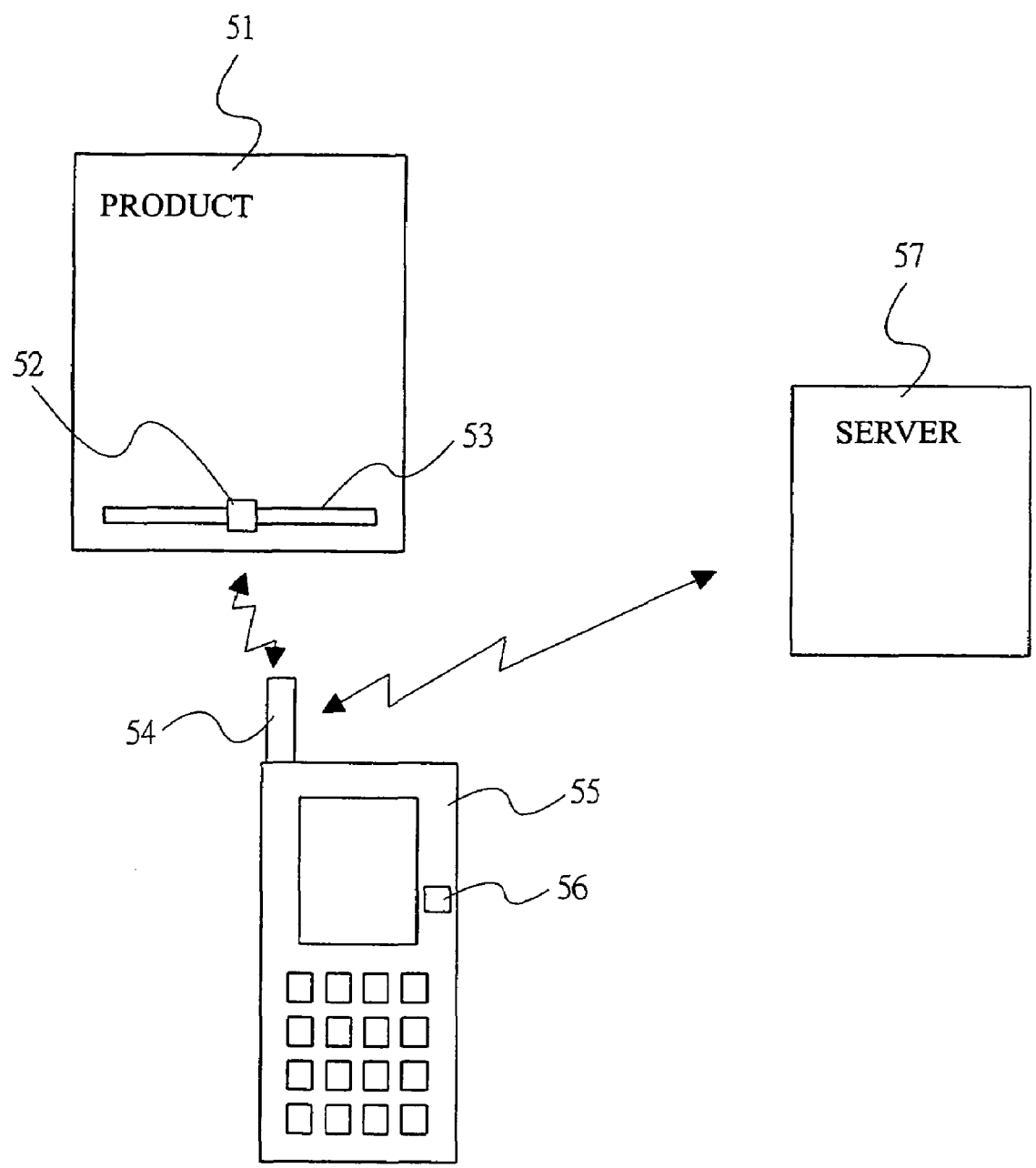
FIG. 24 is an explanatory diagram showing a electronic commerce method according to an eleventh embodiment of the present invention.

FIG. 24 is a diagram showing an electronic commerce method according to an eleventh embodiment of the present invention.

A transponder, in which a radiation antenna 53 is connected to a wireless IC chip 52, is attached to a product 51. A personal identification chip 56 is incorporated in a cellular phone 55 with an antenna 54. Various kinds of information are sent from the cellular phone to a server 57 via wireless. The communication using the cellular phone is performed within a radio frequency of 0.1 MHz to 5 GHz. The wireless IC chip 52 is a micro-miniature silicon wireless IC chip for wireless identification, which is operated within a band of the same frequency as the above-mentioned frequency and which has a size of 0.5 mm square or smaller. Due to its micro-miniature, the IC chip is strengthened with respect to the high stress strength and can be manufactured economically. The identification number written by an electron beam is stored in the wireless IC chip, and the identification number can be wirelessly read through the antenna 54 from the cellular phone 55. The wireless IC chip 52 is attached to the product at the time when the product is shipped from a product supplier such as a maker etc. Individual numbers are given to all of the products, and the identification number of each product is accumulated in the database of the product supplier together with various kinds of data.

Meanwhile, the cellular phone has the identification number for identifying a user, which is stored in the personal identification chip and is usually used as a code for charging during the communication of the cellular phone. When the product corresponding to the identification number of the transponder is ordered to the product supplier by the cellular phone, the effective management can be achieved by linking the personal identification number and the identification number of the wireless IC chip 52.

Figure 25:
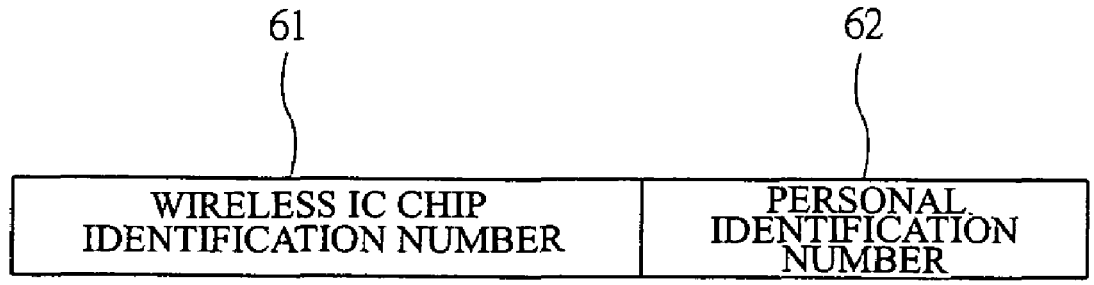
FIG. 25 is a block diagram showing a structure of a data packet transmitted from a cellular phone to a server of a product supplier in an eleventh embodiment of the present invention.

FIG. 25 is a diagram showing a structure of a data packet transmitted from the cellular phone 55 to the server 57 of the product supplier in the eleventh embodiment.

As shown in FIG. 25, the wireless IC chip identification number 61 and the personal identification number 62 are linked in the data packet exchanged between the cellular phone 55 and the server 57. The data packet is a unit for exchanging the data between the cellular phone and the base station, and the format of the packet is defined by the software in advance.

In this case, various advantages can be obtained by setting the wireless IC chip identification number 61 and the personal identification number 62 in one packet. That is, the identification number of the product represents the ordered product to the product supplier, and the personal identification number is one for identifying the orderer, and if they are managed separately, the data management is remarkably complicated.

(Twelfth Embodiment)

Figure 26:
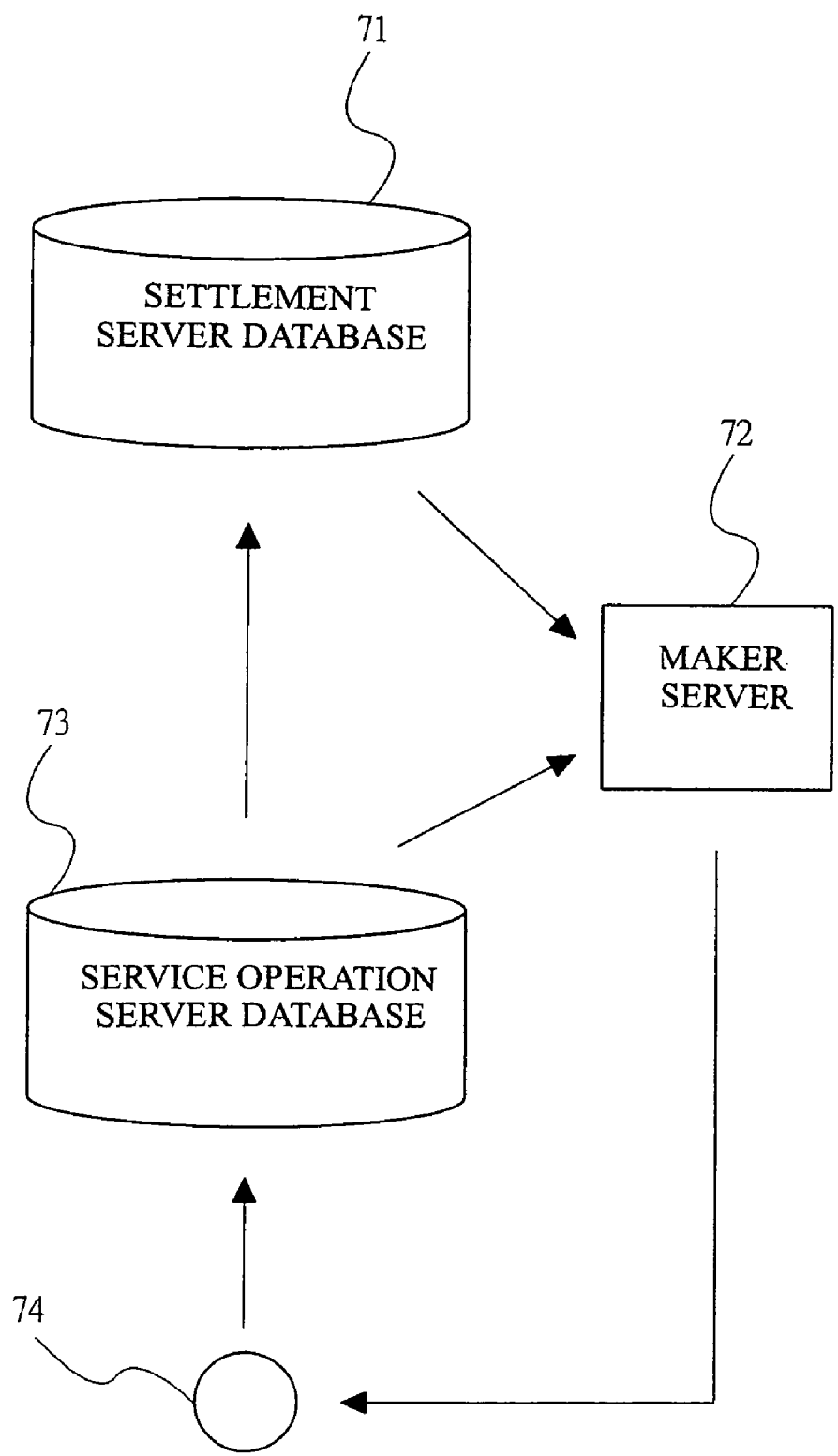
FIG. 26 is an explanatory diagram showing a electronic commerce method according to a twelfth embodiment of the present invention.

FIG. 26 is a diagram showing an electronic commerce method according to a twelfth embodiment of the present invention.

A system for the electronic commerce method according to the twelfth embodiment includes, for example, a settlement server database 71, a maker server 72, a service operation server database 73, and a cellular phone subscriber 74, etc. The settlement server database 71 is connected to the maker server 72 and the service operation server database 73, and the cellular phone subscriber 74 is connected to the service operation server database 73.

The service operation server sends the wireless IC chip identification number and data to the maker server 72 for the purpose of requesting the order transaction, the data being evolved from the personal identification number to personal address data. At this time, the personal identification number is not sent therewith.

Meanwhile, the personal identification number is sent to the settlement server, whereby dealing with the identification and the settlement is requested. At this time, the wireless IC chip identification number is not sent.

Accordingly, the wireless IC chip identification number and the personal identification number are separately managed, thereby allowing for holding the security thereof.

(Thirteenth Embodiment)

Figure 27:
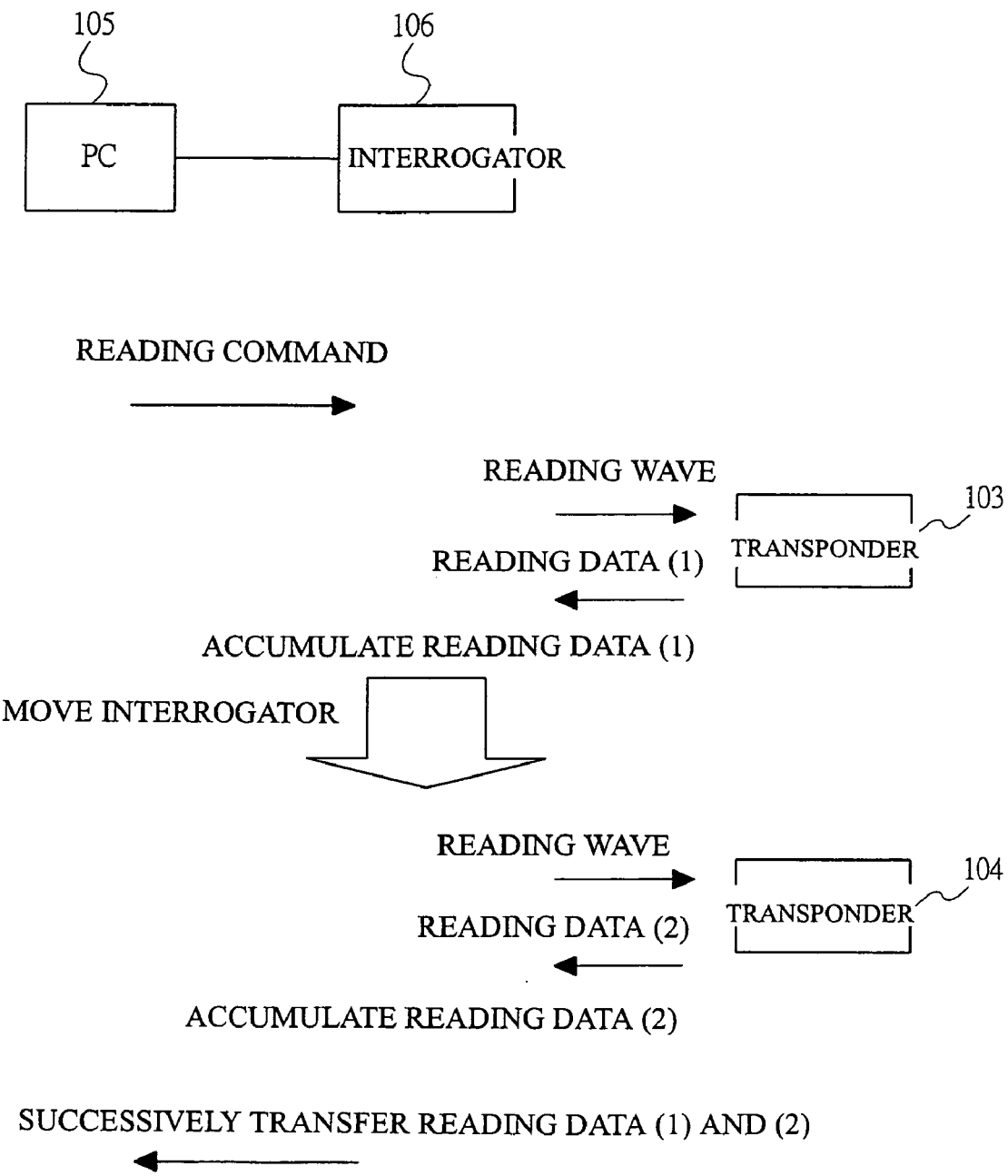
FIG. 27 is an explanatory diagram showing a structure of a transponder reader according to a thirteenth embodiment of the present invention.

FIG. 27 is a diagram showing a structure of a transponder reader according to a thirteenth embodiment of the present invention.

The transponder reader according to the thirteenth embodiment includes, for example, an upper connection machine such as a PC (personal computer) 105 or the like, an interrogator 106, a transponder 103, and a transponder 104, etc.

The upper connection machine such as PC or the like and the interrogator for reading the identification information of the transponder via wave are connected through a serial or parallel interface such as RS232C or the like.

It is assumed that a reading command is now issued from the PC 105 to the interrogator 106. In response to the command, the interrogator 106 sends the reading wave to the transponder 103 and the transponder 103 receives the rated energy and/or the clock signal, and sends the identification information used as the reading data (1) in the transponder 103, from the transponder 103 to the interrogator 106. When the interrogator 106 confirms valid reception, that is, reception without errors, the interrogator 106 accumulates the reading data (1) in the memory device located therein.

Subsequently, the interrogator 106 moves and again sends the reading wave to another transponder 104. The transponder 104 sends the reading data (2) in the transponder 104, to the interrogator 106, through a predetermined procedure. When the interrogator 106 confirms valid reception, that is, reception without errors, the interrogator 106 accumulates the reading data (2) in the memory device located therein.

Thereafter, the reading data (1) and the reading data (2) are successively transferred to the PC 105 through the serial interface or the parallel interface. FIG. 27 illustrates the model in which the interrogator is designed to move. However, a drawing similar to this will be illustrated even in the case of using the model in which the transponder is designed to move.

In FIG. 27, one transponder and two transponders are merely illustrated. However, similarly to this drawing even in the case of using generally three or more transponders, instead of repeatedly issuing the reading command to each transponder and of reading the issued reading command, the identification information of all of the transponders are accumulated in the memory of the interrogator and thereafter the data are collectively transferred from the interrogator 106 to the PC 105. Since there is no interaction (action relative to one another) between the PC 105 and the interrogator 106 in successively reading the identification information of the plurality of transponders from the interrogator 106, the high-speed reading can be realized.

(Fourteenth Embodiment)

Figure 28:
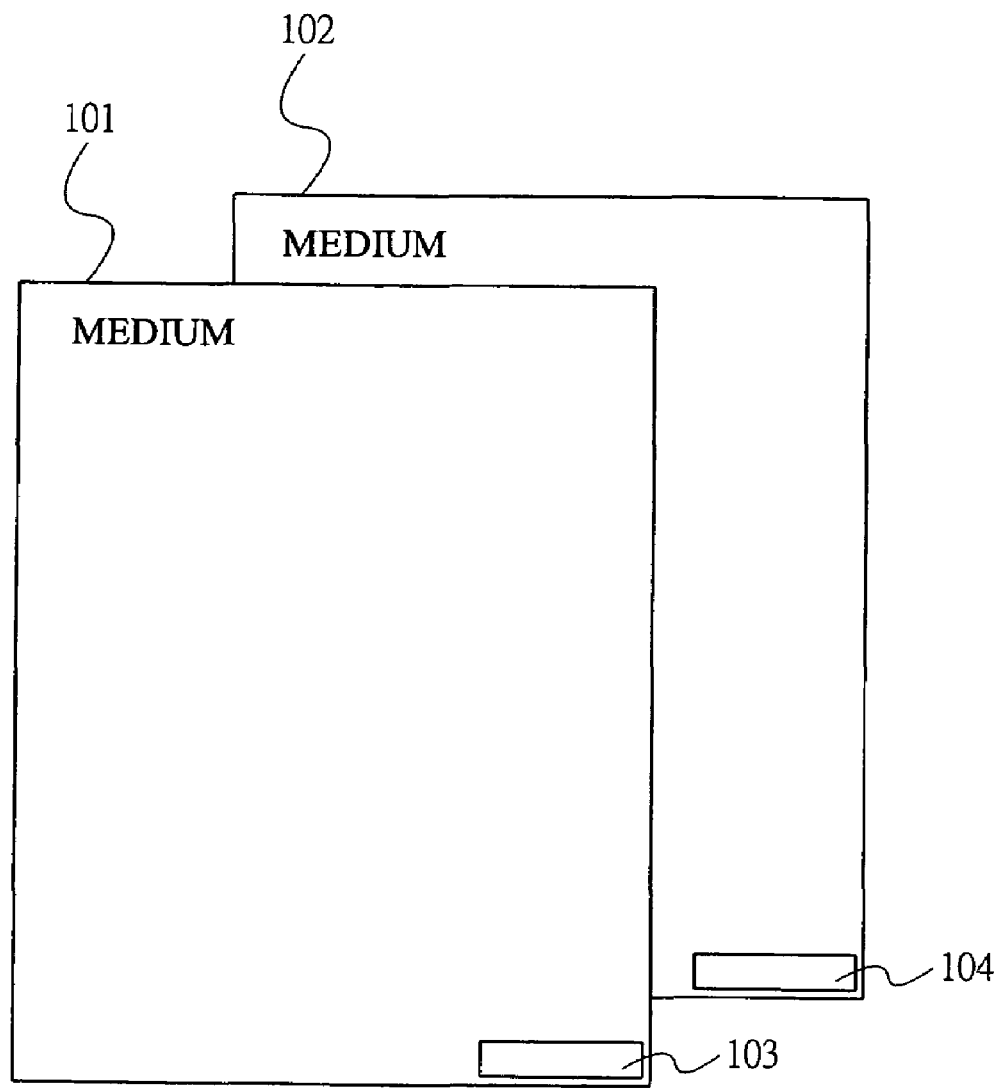
FIG. 28 is a block diagram showing the state where transponders are attached to media in a fourteenth embodiment of the present invention.
Figure 28:
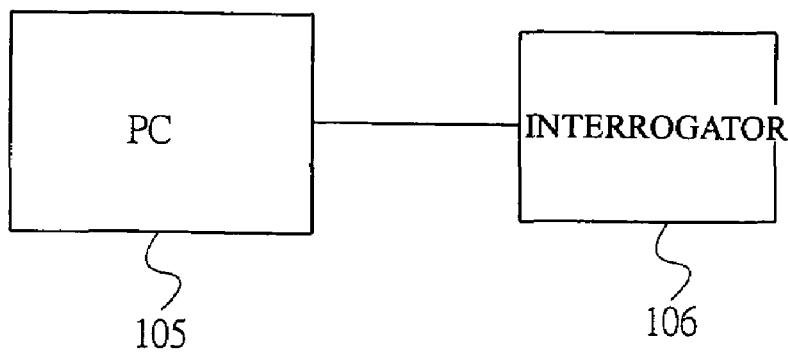

FIG. 28 is a diagram showing the state where transponders are attached to media in to a fourteenth embodiment of the present invention.

The transponder 103 attaches onto a corner portion of a medium 101, and another transponder 104 attaches onto a corner portion of another medium 102. Those media may be used as three or more media overlapped. In such overlapped state, the interrogator 106 connected to the PC 105 sequentially reads the identification information of the transponders 103 and 104 and sends the reading data from the interrogator 106 to the PC 105, in the manner as shown in FIG. 27 (thirteenth embodiment).

At this time, it is preferable to arrange the positions of the transponders 103 and 104 in a line in a self alignment manner. When the transponders are attached onto the corner portions of the media as shown in FIG. 28, the positions of the transponders 103 and 104 can be arranged in a line by aligning the corner portions of the media with each other even if the media have different shapes. The transponders 103 and 104 are attached to the corner portions of the media. However, as its attaching method, the transponders can be attached onto the front, rear, or both surfaces of the media so that the transponders 103 and 104 may be arranged in a line even at the time of its 180 degrees reverse, and additionally the transponder can be also attached onto the bottom surface of the medium. As the antenna on the interrogator side, the radio wave range is needed to be narrowed as much as possible, and such methods as using a coaxial antenna or a low-power antenna and as shielding partially the antenna can be used for its achievement.

In the foregoing, the invention made by the inventors has been concretely described based on the embodiments. However, needless to say, the present invention is not limited to the foregoing embodiments and can be variously modified and altered without departing from the gist thereof.

The advantages achieved by the typical ones of the inventions disclosed in this application will be briefly described as follows.

(1) In a semiconductor device such as a wireless IC tag etc., each one electrode is preferably provided on the front surface and the rear surface of the wireless IC chip, thereby allowing for obtaining a relatively large electrode size and ensuring the connection area thereof. Additionally, the connection resistance thereof is reduced and the operation of the semiconductor device is made stable.

(2) In a semiconductor device such as a wireless IC tag etc., the wireless IC chip is preferably arranged within a space of several millimeters, whereby the high-precision alignment is unnecessary and the batch process for simultaneously aligning a plurality of wireless IC chips can be used. As a result, it is possible to achieve the economical fabrication of the wireless IC tag etc.

(3) In a semiconductor device such as a wireless IC tag etc., since one electrode is placed on each surface, the distance between the electrodes does not become short. Also, since the device does not matter if the chips are turned up side down, it is unnecessary to set the upper surfaces of the chips, thereby allowing the chips to be arranged at once and the wireless IC tag etc. to be fabricated economically.

(4) In a semiconductor device such as a wireless IC tag etc., since one electrode is provided on one surface and there is no gap between the wireless IC chip and the substrate, the stress strength and the reliability can be ensured economically. Additionally, the electrode itself has a role to increase the stress strength.

(5) In a semiconductor device such as a wireless IC tag etc., since the slits are provided in the conductor, the impedance matching is made certainly, thereby allowing the reduction of the communication distance to be prevented.

(6) In a semiconductor device such as a wireless IC tag etc., it is possible to reuse the wireless IC tag, which has been used as a disposable device.

(7) In an electronic commerce, by the use of a cellular phone, the identification number of the transponder attached to a product is read via wireless and is immediately linked via wireless to a server of a maker. Therefore, its speediness, accuracy, and economical efficiency can be improved.

(8) In a transponder reader, the command from the upper connection machine to the interrogator works only at the beginning of the successive reading and reads the identification information of the transponder without exchanging the commands on the way, thereby allowing the high-speed successive reading to be performed.

What is claimed is:

1. A wireless IC tag comprising: a plate-shaped first conductor; a plate-shaped second conductor; and an IC chip, wherein said IC chip is sandwiched between said first conductor and said second conductor via a front surface and a rear surface of said IC chip, wherein said IC chip includes a double voltage rectifier circuit to rectify an alternating voltage induced between the front surface and the rear surface of said IC chip, wherein said second conductor is adapted to function as an antenna, wherein said second conductor includes a slit extending from a center portion thereof in a longitudinal direction, and wherein said first conductor electrically connects both sides of said slit of said second conductor via the front surface and the rear surface of said IC chip.

2. The wireless IC tag according to claim 1,
wherein said double voltage rectifier circuit includes a capacitor, a first diode, and a second diode,
wherein one end of said capacitor is connected to a cathode of said first diode and an anode of said second diode, and
wherein an anode of said first diode is electrically connected to the rear surface of said IC chip.

3. The wireless IC tag according to claim 2,
wherein, during a time when an alternating voltage is induced between the front surface and the rear surface of said IC chip, the anode of said first diode, a substrate potential of said IC chip, and the rear surface of said IC chip all have the same potential.

4. The wireless IC tag according to the claim 1,
wherein the plate-shaped first conductor and the plate shaped second conductor are coupled via an anisotropic conductive adhesive.

5. The wireless IC tag according to the claim 4,
wherein the plate-shaped first conductor and the plate-shaped second conductor are coupled by pressure bonding.

6. A wireless IC tag comprising: a plate-shaped first conductor; a plate-shaped second conductor; and an IC chip,
wherein said IC chip includes a double voltage rectifier circuit, a first electrode on a front surface thereof, and a second electrode on a rear surface thereof,
wherein said double voltage rectifier circuit is adapted to rectify an alternating voltage induced between said first electrode and said second electrode,
wherein at least one of said first conductor and said second conductor includes a slit extending from a center portion thereof in a longitudinal direction, and
wherein at least one of said first conductor and said second conductor electrically connects both sides of said slit of the other conductor via said first electrode and said second electrode.

7. The wireless IC tag according to claim 6,
wherein said double voltage rectifier circuit includes a capacitor, a first diode, and a second diode,
wherein one end of said capacitor is connected to a cathode of said first diode and an anode of said second diode, and
wherein an anode of said first diode is electrically connected to the rear surface of said IC chip.

8. The wireless IC tag according to claim 7,
wherein, during a time when an alternating voltage is induced between the front surface and the rear surface of said IC chip, the anode of said first diode, a substrate potential of said IC chip, and the rear surface of said IC chip all have the same potential.

9. The wireless IC tag according to claim 6,
wherein the plate-shaped first conductor and the plate-shaped second conductor are coupled by pressure bonding.

10. The wireless IC tag according to claim 9,
wherein the plate-shaped first conductor and the plate-shaped second conductor are coupled via an anisotropic conductive adhesive.

11. A wireless IC tag comprising: a plate-shaped first conductor; a plate-shaped second conductor; and an IC chip,
wherein at least one of said first conductor and said second conductor is adapted to function as an antenna;
wherein said IC chip includes a first electrode formed on a front surface thereof, a second electrode formed on a rear surface thereof, and a rectifier circuit including a first diode, a second diode, and a capacitor,
wherein one end of said capacitor is connected to said first electrode,
wherein the other end of said capacitor is connected to a cathode of said first diode and an anode of said second diode,
wherein an anode of said first diode is connected to said second electrode,
wherein said second electrode has the same potential as a substrate potential of said IC chip,
wherein at least one of said first conductor and said second conductor includes a slit extending from a center portion thereof in a longitudinal direction,
wherein said IC chip is electrically connected between said first conductor and said second conductor via said first electrode and said second electrode, and
wherein the other ends of said first conductor and said second conductor are electrically connected to each other across said slit.

12. The wireless IC tag according to claim 11,
wherein said first diode and said second diode are formed of MOS transistors each having a gate and a drain thereof connected to one another.

13. The wireless IC tag according to claim 11,
wherein said capacitor is a MOS transistor having a gate corresponding to one end of said capacitor and a drain or a source corresponding to the other end of said capacitor.

14. The wireless IC tag according to claim 11,
wherein said IC chip is connected between said first conductor and said second conductor via anisotropic conductive adhesive.

15. The wireless IC tag according to claim 11,
wherein at least one of said first conductor and said second conductor forms a plate-shaped dipole antenna.

16. The wireless IC tag according to claim 11,
wherein said slit is provided in said second conductor, and said first conductor extends across said slit.

17. The wireless IC tag according to claim 11,
wherein the plate-shaped first conductor and the plate-shaped second conductor are coupled by pressure bonding.

* * * * *